(12) United States Patent
Yamada et al.

(10) Patent No.: US 7,549,811 B2
(45) Date of Patent: Jun. 23, 2009

(54) SUBSTRATE TREATING APPARATUS

(75) Inventors: Yoshihisa Yamada, Kyoto (JP); Masafumi Maeda, Kyoto (JP); Takashi Taguchi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 11/948,198

(22) Filed: Nov. 30, 2007

(65) Prior Publication Data

US 2008/0092805 A1  Apr. 24, 2008

Related U.S. Application Data

(62) Division of application No. 11/008,842, filed on Dec. 10, 2004, now Pat. No. 7,323,060.

(30) Foreign Application Priority Data

Dec. 11, 2003 (JP) ............................. 2003-413275

(51) Int. Cl.
*G03D 5/00* (2006.01)
*G03B 13/00* (2006.01)
*G03B 27/52* (2006.01)
*B05C 11/02* (2006.01)
*B05B 13/04* (2006.01)

(52) U.S. Cl. .................... 396/611; 396/571; 118/52; 118/320; 355/27; 414/935

(58) Field of Classification Search .............. 396/571, 396/611; 355/27; 118/52, 66, 319, 320, 118/500; 414/222.01, 935
See application file for complete search history.

(56) References Cited

U.S. PATENT DOCUMENTS 5,935,768 A  8/1999 Biche et al.

6,402,401 B1  6/2002 Ueda et al.
6,893,171 B2 *  5/2005 Fukutomi et al. ........... 396/611
2003/0091410 A1  5/2003 Larson et al.

FOREIGN PATENT DOCUMENTS

| CN | 1455438 | 11/2003 |
|---|---|---|
| JP | 6-151293 | 5/1994 |
| JP | 8-17724 | 1/1996 |

OTHER PUBLICATIONS

Office Action dated Nov. 17, 2006 for corresponding Chinese Patent Application No. 2004-101032576.

* cited by examiner

*Primary Examiner*—Alan A Mathews
(74) *Attorney, Agent, or Firm*—Ostrolenk, Faber, Gerb & Soffen, LLP

(57) ABSTRACT

A forward direction-only path (first substrate transport path) is formed for transporting substrates in a forward direction to pass the substrates on to an exposing apparatus. A separate, substrate transport path (second substrate transport path) is formed exclusively for post-exposure bake (PEB). Substrate transport along each path is carried out independently of substrate transport along the other. A fourth main transport mechanism is interposed as a predetermined substrate transport mechanism between transfer points consisting of a buffer acting as a temporary storage module for temporarily storing the substrates and a post-exposure bake (PEB) unit corresponding to a predetermined treating unit. This arrangement forms the path for transporting the substrates between the buffer and the PEB unit, to allow PEB treatment of the substrates to be performed smoothly. Similarly, the substrates are transported smoothly to the buffer.

1 Claim, 21 Drawing Sheets

SUBSTRATE TREATING APPARATUS

CROSS REFERENCE TO RELATED APPLICATIONS

The present application is a Divisional Application of U.S. Ser. No. 11/008,842 filed Dec. 24, 2004, which application claims the benefit and priority of Japanese Application No. 2003-413275, filed Dec. 11, 2003, incorporated by reference in their entirety.

BACKGROUND OF THE INVENTION

1. Field of the Invention

This invention relates to substrate treating apparatus for treating semiconductor wafers, glass substrates for liquid crystal displays, glass substrates for photomasks, and substrates for optical disks (hereinafter called simply "substrates").

2. Description of the Related Art

Conventionally, such a substrate treating apparatus is used in a photolithographic process for forming photoresist film on substrates, exposing the substrates having the photoresist film formed thereon, and developing the exposed substrates, as disclosed in Japanese Unexamined Patent Publications Nos. 6-151293 (1994) and 8-17724 (1996), for example).

A conventional substrate treating apparatus includes substrate treating units such as a photoresist forming unit and a developing unit, and an interface unit for transferring substrates between the substrate treating apparatus and an exposing apparatus (stepper) which is an external apparatus. Substrates coated with photoresist are transferred to the exposing apparatus through the interface unit. A chemically amplified photoresist has been used extensively in recent years. This type of photoresist requires a strict control of the time from exposure to heating of substrates in order to maintain high patterning precision. To meet this requirement, the conventional substrate treating apparatus has heating and cooling modules arranged in the interface unit for heating exposed substrates promptly. A substrate returned from the exposing apparatus to the interface unit is promptly loaded into the heating module in the interface unit by a substrate transport mechanism of the interface unit. The substrate heated is then loaded into the cooling module in the interface unit to be cooled to room temperature. The substrate having received post-exposure baking (PEB) treatment in this way is passed from the interface unit to the substrate treating units, and is developed in the developing unit included in the substrate treating units.

The conventional apparatus with such a construction has the following problems (I)-(VI):

Problem (I)

The substrate transport mechanism of the interface unit performs the transport to the post-exposure bake (PEB) described above, besides transport in a forward direction from the photoresist forming unit to the exposing apparatus, and transport in a backward direction from the exposing apparatus to the developing unit. When, for example, substrates are delivered from the exposing apparatus while the interface's transport mechanism is engaged in the transport in the forward direction, the substrates delivered must wait until the transport in the forward direction is finished. As a result, the exposed substrates cannot receive heating treatment promptly.

Problem (II)

In the substrate treating apparatus, a spin chuck and a nozzle usually are in the same positional relationship for each chemical treating unit (e.g. an antireflection film forming unit for forming antireflection film under photoresist film in order to reduce standing wave and halation occurring in time of exposure, and a resist film forming unit). That is, where a nozzle is disposed on the right-hand side of a spin chuck in the antireflection film forming unit, a nozzle is disposed on the right-hand side of a spin chuck also in the resist film forming unit. In this case, a substrate transport mechanism that loads and unloads substrates into/from the antireflection film forming unit could interfere with the nozzle therein, and a substrate transport mechanism that loads and unloads substrates into/from the resist film forming unit could interfere with the nozzle therein.

Problem (III)

An example of heating module has a temporary substrate deposit. This heating module includes, besides a heating plate and the temporary substrate deposit, a holding plate acting as a local transport mechanism. The holding plate is movable to and from the heating plate and temporary substrate deposit, and includes a cooling mechanism. The holding plate receives a substrate heated by the heating plate, cools the substrate with the cooling mechanism while holding the substrate, and then places the substrate in the temporary substrate deposit.

This heating module has the temporary substrate deposit, heating plate and holding plate arranged in a direction perpendicular to a substrate transport path. This arrangement results in unused spaces in the direction perpendicular to directions of transport along the substrate transport path. Where chemical treating modules are stacked in multiple stages, pumps are arranged en bloc on the floor of the apparatus for supplying treating solutions to the chemical treating modules. Thus, the treating solutions are delivered to the chemical treating modules in upper stages as sucked up by the pumps. However, the suck-up action of the pumps may be impaired by viscosity of the treating solutions. It is therefore desirable to provide the pumps for the respective treating modules stacked in multiple stages. However, since space-saving in the perpendicular direction noted above is impossible, the pumps cannot be arranged in multiple stages.

Problem (IV)

An indexer includes a cassette table for receiving cassettes containing substrates to be treated. The substrates to be treated are successively fetched from the cassettes and delivered to the treating units. Treated substrates are successively received from the treating units and deposited in the cassettes. Where substrate rests for transfer of the substrates are provided between the indexer and an adjacent one of the treating units (e.g. an antireflection film forming unit), the substrate rests take up their own installation space.

Problem (V)

As noted in problem (IV) above, an installation space is required for the substrate rests between the indexer and the adjacent treating unit. Such spaces are required also between other adjoining treating units. That is, substrate rests between each adjacent pair of treating units take up their own installation space.

Problem (VI)

In order to cool a substrate, the substrate is moved perpendicular to the substrate transport path (in a direction extending between front and back of the apparatus). The substrate is transferred after heat treatment in a heat-treating module.

Cooling modules are often stacked with heating modules, and may therefore be subject to thermal influence.

SUMMARY OF THE INVENTION

This invention has been made having regard to the state of the art noted above, and its object is to provide substrate treating apparatus (1) for treating substrates smoothly in predetermined treating units, (II) for reducing interference between a substrate transport mechanism and a supply pipe (nozzle) in a chemical treating module, (III) for achieving space-saving in a direction perpendicular to directions of transport along a substrate transport path, (IV) for achieving space-saving with respect to an installation space between an indexer and an adjacent treating unit, (V) for achieving space-saving with respect to an installation space between each adjacent pair of treating units, and (VI) for transferring substrates between blocks (cells) efficiently while performing chemical treatment and heating treatment appropriately.

In order to solve problem (I) above, this invention provides a substrate treating apparatus having treating units for treating substrates, and substrate transport mechanisms for transferring the substrates to and from the treating units, the apparatus comprising a first substrate transport path for transporting the substrates between the treating units, the first substrate transport path including a plurality of substrate transport mechanisms arranged with a transfer point interposed therebetween for transferring the substrates, and a second substrate transport path for transporting the substrates between a temporary storage module for temporarily storing the substrates and a predetermined one of the treating units, the temporary storage module and the predetermined one of the treating units being arranged at transfer points, respectively, with a predetermined substrate transport mechanism interposed therebetween.

The above substrate treating apparatus according to this invention provides the second substrate transport path separately from the first substrate transport path, so that substrate transport along each substrate transport path may be carried out independently of substrate transport along the other. A predetermined main transport mechanism is interposed between transfer points consisting of a temporary storage module for temporarily storing the substrates and a predetermined treating unit. This arrangement forms the second substrate transport path for transporting the substrates between the temporary storage module and the predetermined treating unit, to allow the substrates to be treated smoothly in the predetermined treating unit. Similarly, the substrates are transported smoothly to the temporary storage module.

In the substrate treating apparatus provided for solving problem (I), the first and second substrate transport paths may partly overlap each other. The first and second substrate transport paths may share one of the substrate transport mechanisms, or may be formed by using different ones of the substrate transport mechanisms. In the former case of sharing the same substrate transport mechanism, this substrate transport mechanism can transport the substrate along each of the first and second substrate transport paths. In the latter case of using different substrate transport mechanisms, waiting times accompanying the transport by one substrate transport mechanism may be reduced, whereby the substrate may be treated with increased smoothness.

In one specific example of substrate treating apparatus according to this invention, the first substrate transport path is arranged to transport the substrates between the treating units and an exposing apparatus acting as an external device juxtaposed with the substrate treating apparatus, the predetermined one of the treating units is a post-exposure baking unit for heating the substrates after exposure in the exposing apparatus, and the second substrate transport path is arranged to transfer and transport the substrates between the temporary storage module and the post-exposure baking unit.

In this specific example according to the invention, the first substrate transport path is arranged to transport the substrates between the treating units and an exposing apparatus acting as an external device juxtaposed with the substrate treating apparatus. The predetermined treating unit is a post-exposure baking unit for heating the substrates after exposure in the exposing apparatus. The second substrate transport path is arranged to transfer and transport the substrates between the temporary storage module and the post-exposure baking unit. Thus, the substrates are treated smoothly by the post-exposure baking unit. That is, post-exposure bake is carried out promptly after exposure. Similarly, the substrate heated by the post-exposure baking unit may be transported smoothly to the temporary storage module.

In the above specific example according to the invention, the first substrate transport path may be arranged to serve as a forward direction-only path for transporting the substrates in a forward direction to pass the substrates on to the exposing apparatus. This construction is effective to reduce a waiting time caused by the substrates transported in the forward direction on the transport of the substrates to the post-exposure baking unit to receive post-exposure baking treatment therein. Similarly, in the above specific example according to the invention, the first substrate transport path may be arranged to serve as a backward direction-only path for transporting the substrates in a backward direction after receiving the substrates from the exposing apparatus. This construction is effective to reduce a waiting time caused by the substrates transported in the backward direction on the transport to the temporary storage module of the substrates having received post-exposure baking treatment.

The substrate treating apparatus may further comprise a cooling module for cooling the substrates, the second substrate transport path being arranged to transfer and transport the substrates between the cooling module, the temporary storage module and the post-exposure baking unit. This construction can smoothly perform cooling treatment after post-exposure baking treatment.

In order to solve problem (II) above, this invention provides a substrate treating apparatus having chemical treating modules for chemically treating substrates, substrate transport mechanisms for transferring the substrates to and from treating units including the chemical treating modules, wherein each of the chemical treating modules includes a holder for holding a substrates and a supply pipe for supplying a chemical solution to the substrate during chemical treatment, and when adjacent ones of the substrate transport mechanisms and adjacent ones of the chemical treating modules are arranged in the same direction, the supply pipes are arranged outwardly and the holders are arranged inwardly with respect to a boundary line between the adjacent ones of the substrate transport mechanisms.

In the substrate treating apparatus according to this invention, the supply pipes are arranged outwardly and the holders are arranged inwardly with respect to the boundary line between the adjacent substrate transport mechanisms. This construction prevents interference between the adjacent substrate transport mechanisms and the supply pipes, and allows the substrate transport mechanisms to transfer the substrates to and from the respective substrate holders easily.

In order to solve problem (III) above, this invention provides a substrate treating apparatus having heating modules for heating substrates, and substrate transport mechanisms for transferring the substrates to and from treating units each including the heating modules, wherein each of the heating modules includes a temporary substrate deposit for temporarily storing the substrates, a heating plate for heating the substrates, and a holding plate movable to and from the temporary substrate deposit and the heating plate, the temporary substrate deposit and the heating plate being juxtaposed with the holding plate along a substrate transport path formed between the treating units.

This substrate treating apparatus has the temporary substrate deposit and heating plate arranged along the substrate transport path. Such an arrangement realizes a space-saving in a direction perpendicular to transport directions along the substrate transport path.

In one specific example of substrate treating apparatus for solving problem (III) above, the apparatus further comprises chemical treating modules arranged in multiple stages for chemically treating the substrates, the chemical treating modules having respective pumps thereof opposed to the heating modules across the substrate transport path.

In this specific example according to the invention, the pumps provided for the chemical treating modules, respectively, are opposed to the heating modules across the substrate transport path. Thus, the pumps are arranged in multiple stages in a vacant space resulting from the space-saving. Consequently, connections between the pumps and the chemical treating modules may be arranged in horizontal planes, thereby avoiding the difficulties in suck-up action due to the viscosity of each treating solution (i.e. chemical solution).

In order to solve problem (IV) above, this invention provides a substrate treating apparatus having heat-treating modules arranged in multiple stages for heat-treating substrates, and substrate transport mechanisms for transferring the substrates to and from a treating unit including the heat-treating modules, the apparatus comprising an indexer including a cassette table for receiving a cassette storing substrates to be treated, the indexer successively fetching the substrates to be treated from the cassette, and successively depositing treated substrates in the cassette, and predetermined treating modules arranged adjacent the heat-treating modules in the multiple stages and along an indexer's transport path, the heat-treating modules including substrate rests for transferring the substrates between the indexer and the predetermined treating modules.

This substrate treating apparatus has the substrate rests for transferring the substrates included in the heat-treating modules arranged in multiple stages. This construction dispenses with substrate rests between the indexer and adjacent treating unit. Thus, a space-saving is achieved with regard to an installation space between the indexer and adjacent treating unit.

In order to solve problem (V) above, this invention provides a substrate treating apparatus having heat-treating modules for heat-treating substrates, and substrate transport mechanisms for transferring the substrates to and from a treating unit including the heat-treating modules, wherein the heat-treating modules include cooling modules for cooling the substrates, and heating modules for heating the substrates, the cooling modules and the heating modules are thermally divided from each other, the cooling modules include substrate rests for transferring the substrates therethrough, and the substrates are transported through the substrate rests obliquely with respect to a substrate transport path.

This substrate treating apparatus thermally divides the cooling modules and heating modules, provides substrates rests in the cooling modules, and transports the substrates through the substrate rests obliquely with respect to a substrate transport path. This construction need not take thermal influences into consideration, and requires no substrate rests to be disposed between the treating units. Thus, a space-saving is achieved with regard to an installation space between the treating units.

In order to solve problem (VI) above, this invention provides a substrate treating apparatus having heat-treating modules for heat-treating substrates, chemical treating modules for chemically treating the substrates, and substrate transport mechanisms for transferring the substrates to and from a treating unit including the heat-treating modules and the chemical treating modules, wherein the heat-treating modules include cooling modules for cooling the substrates, and heating modules for heating the substrates, the cooling modules and the heating modules are thermally divided from each other, the heating modules and the chemical treating modules form treating blocks opposed to each other across a substrate transport path formed along the treating units, and the cooling modules serve to transfer the substrates between the treating blocks.

In this substrate treating apparatus, the cooling modules serve to transfer the substrates between the treating blocks. Thus, while chemical treatment and heating treatment are carried out appropriately in the respective treating blocks, the substrates may be cooled in the course of transfer between the treating blocks. As a result, the substrates are transferred efficiently.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Preferred embodiments of this invention will be described in detail hereinafter with reference to the drawings.

First Embodiment

Figure 1:
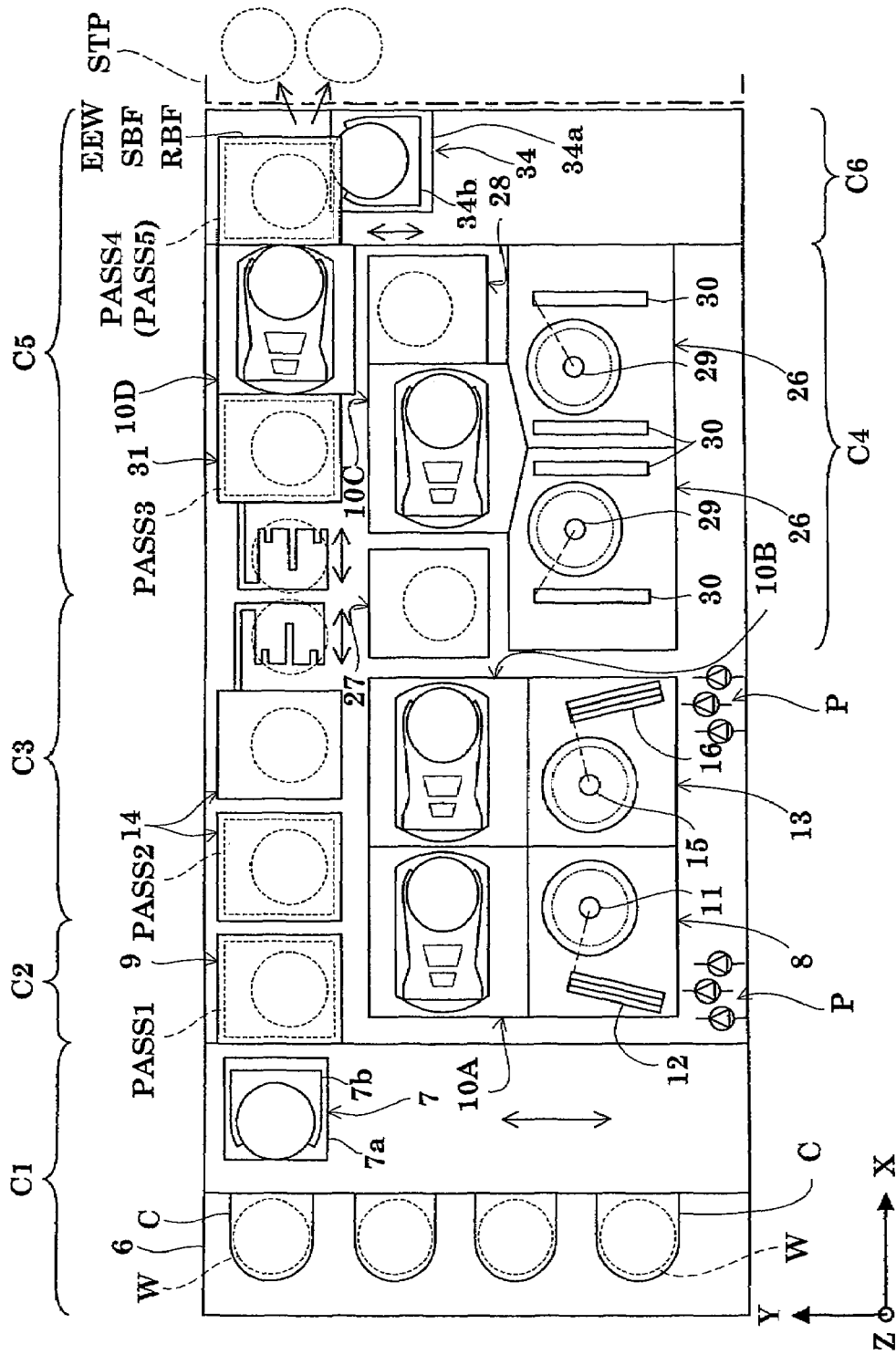
FIG. 1 is a plan view showing an outline of a substrate treating apparatus in a first embodiment.
Figure 2:
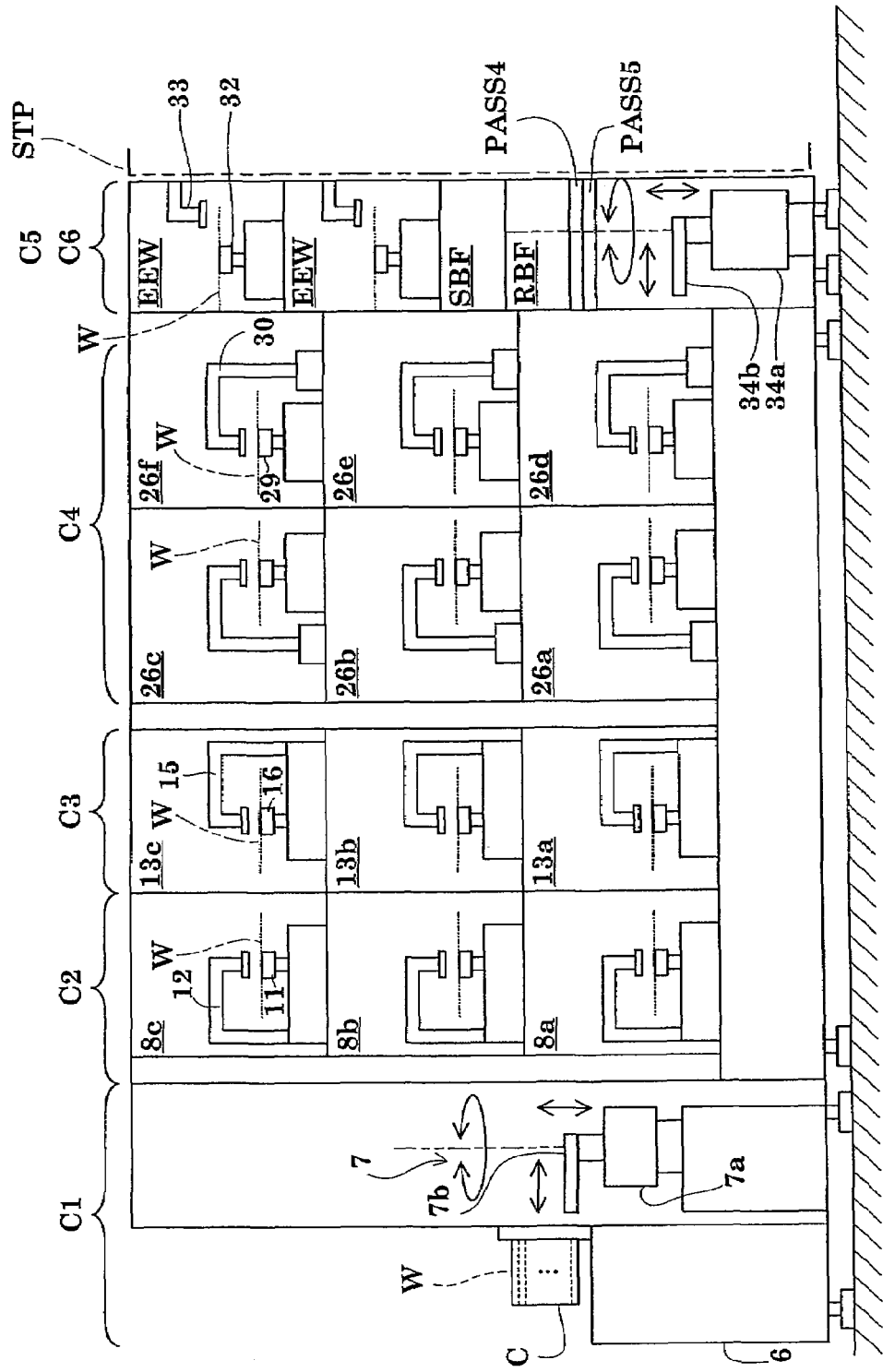
FIG. 2 is a front view showing an outline of the apparatus in the first embodiment.
Figure 3:
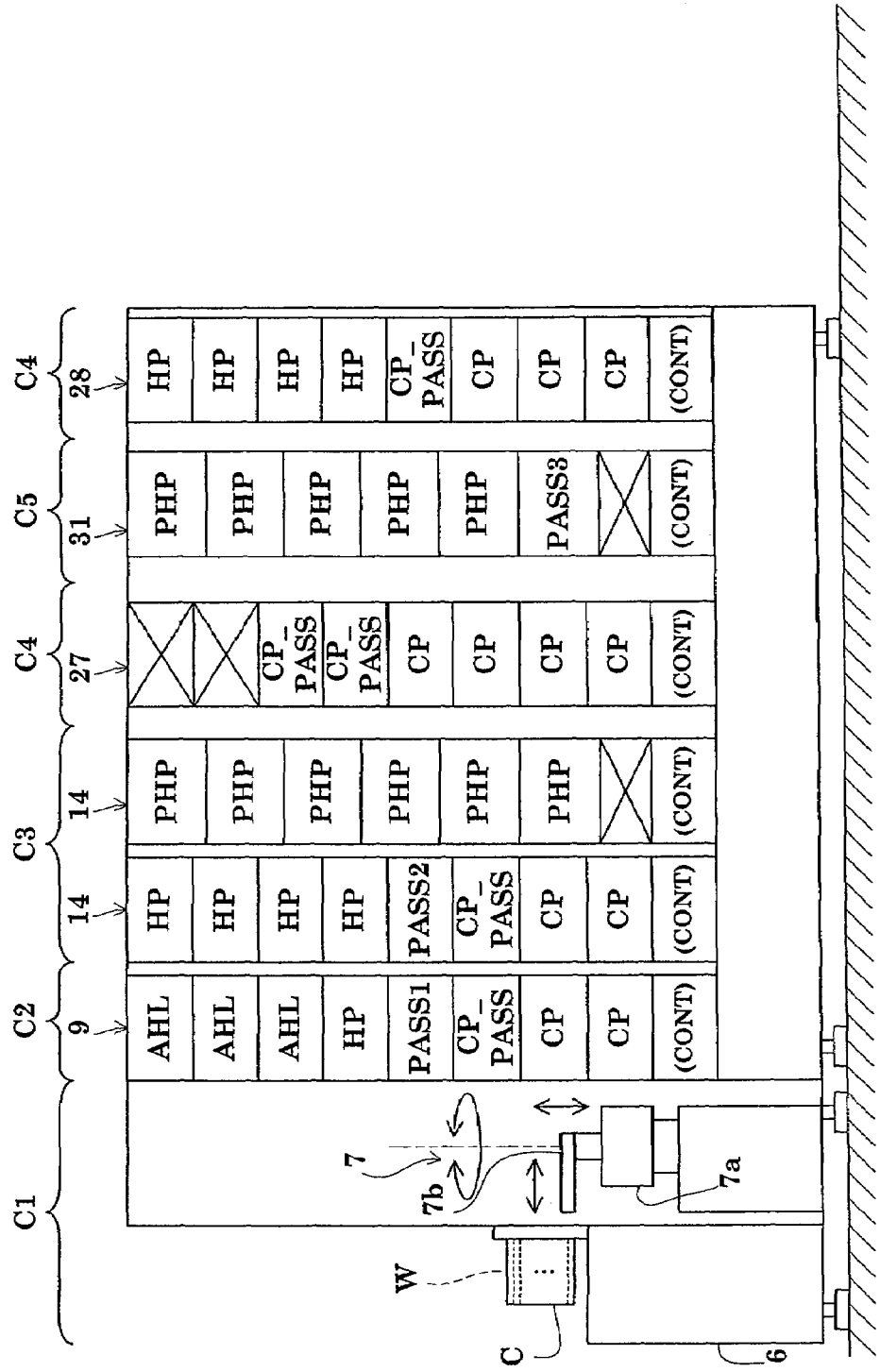
FIG. 3 is a front view of heat-treating modules.

FIG. 1 is a plan view showing an outline of a substrate treating apparatus in a first embodiment. FIG. 2 is a front view showing an outline of the apparatus in the first embodiment. FIG. 3 is a front view of heat-treating modules.

The illustrated apparatus is a substrate treating apparatus constructed to perform chemical treatment for forming antireflection film and photoresist film on semiconductor wafers (hereinafter called simply "substrates or wafers") and developing exposed substrates. The substrates handled by the substrate treating apparatus according to this invention are, of course, not limited to semiconductor wafers, but include various substrates such as glass substrates for liquid crystal displays. The chemical treatment is not limited to formation of photoresist film or the like or development, but includes various other chemical treatments.

Figure 8:
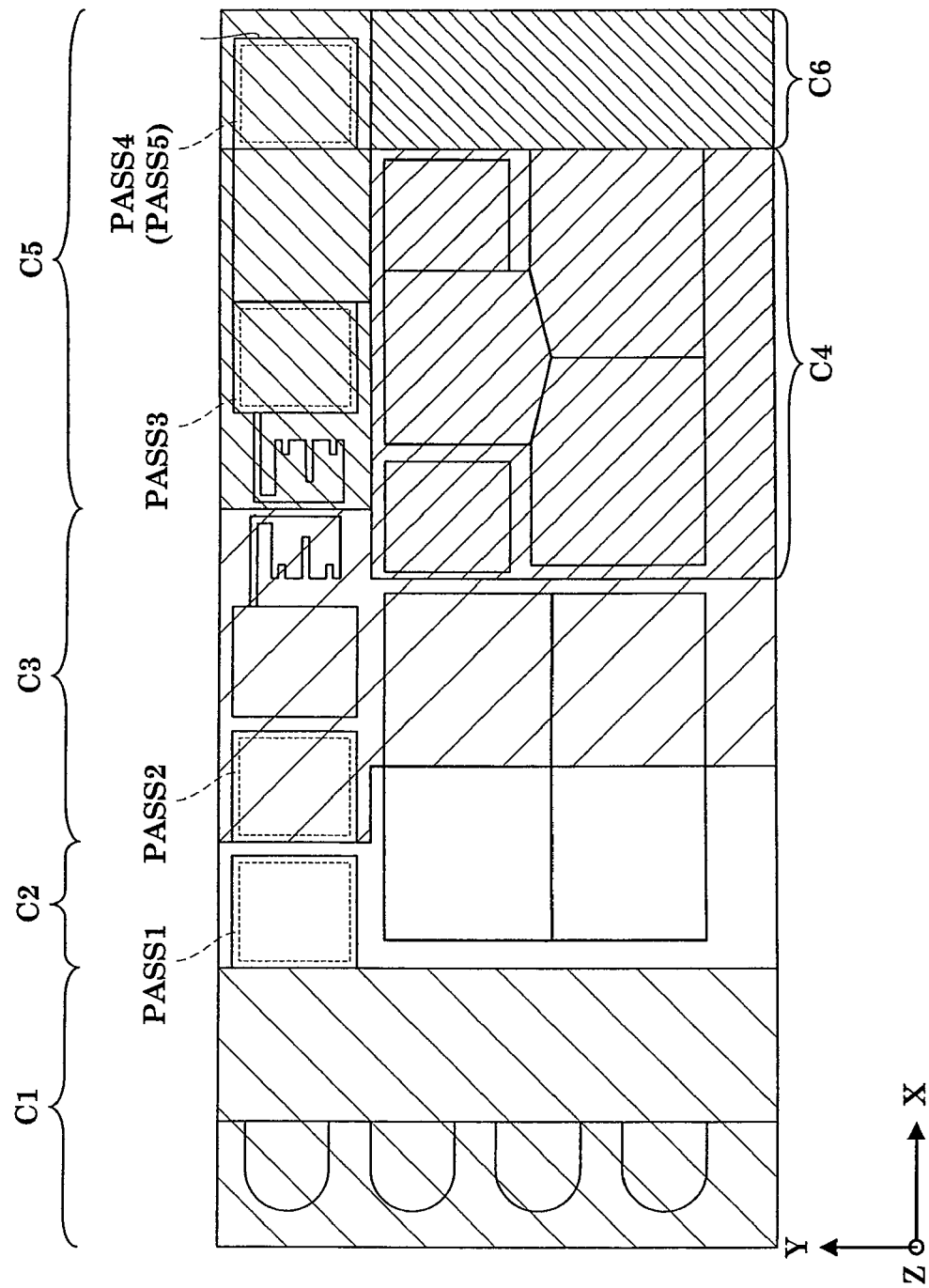
FIG. 8 is a plan view showing an arrangement of cells in the apparatus in the first embodiment.

The substrate treating apparatus in the first embodiment includes an indexer cell C1 for fetching wafers W from cassettes C each for containing a plurality of wafers W in multiple stages, and depositing wafers W in the cassettes C, an antireflection film forming cell C2 for forming antireflection film under photoresist film in order to reduce standing wave and halation occurring in time of exposure, a resist film forming cell C3 for forming photoresist film over the antireflection film formed on wafers W, a developing cell C4 for developing exposed wafers W, a post-exposure baking cell C5 for heating exposed wafers W before development, and an interface cell C6 for transferring wafers W to and from an exposing apparatus (e.g. stepper) STP which is an apparatus separate from the substrate treating apparatus (see FIG. 8). The above exposing apparatus STP is disposed next to the interface cell C6.

The indexer cell C1 will be described first. The indexer cell C1 is a mechanism for fetching wafers W from cassettes C each for containing a plurality of wafers W in multiple stages, and depositing wafers W in the cassettes C. Specifically, the indexer cell C1 includes a cassette table 6 for receiving a plurality of cassettes C in juxtaposition, and an indexer's transport mechanism 7 for successively fetching wafers W to be treated from each cassette C, and successively depositing treated wafers W in each cassette C. The transport mechanism 7 has a movable base 7a for horizontal movement (in Y-direction) along the cassette table 6. A holding arm 7b is mounted on the movable base 7a for holding a wafer W in horizontal posture. On the movable base 7a, the holding arm 7b is vertically movable (in Z-direction), swingable in a horizontal plane, and extendible and retractable radially of the swinging movement.

The antireflection film forming cell C2 will be described next. The antireflection film forming cell C2 is a mechanism for forming antireflection film under photoresist film in order to reduce standing wave and halation occurring in time of exposure. Specifically, this cell C2 includes antireflection film coating modules 8 for coating the surfaces of wafers W with antireflection film, antireflection film heat-treating modules 9 for heat-treating the wafers W in relation to formation of the antireflection film, and a first main transport mechanism 10A for transferring the wafers W to and from the antireflection film coating modules 8 and antireflection film heat-treating modules 9.

In the antireflection film forming cell C2, the coating modules 8 and heat-treating modules 9 are opposed to each other across the first main transport mechanism 10A. Specifically, the coating modules 8 are disposed in a front area of the apparatus, while the heat-treating modules 9 are disposed in a rear area of the apparatus. The other, resist film forming cell C3 also shares the above feature of arranging the chemical treating modules and heat-treating modules in the opposite areas across the main transport mechanism. In such an arrangement, the chemical treating modules and heat-treating modules are spaced away from each other, and hence a reduced chance of the chemical treating modules coming under the thermal influence of the heat-treating modules. In the first embodiment, heat barriers, not shown, are formed in front of the heat-treating modules 9 to avoid the thermal influence on the antireflection film coating modules 8. Similar heat barriers are formed in the other, resist film forming cell C3 also.

As shown in FIG. 2, the antireflection film coating modules 8 consist of three antireflection film coating modules 8a-8c (hereafter referenced "8" where the individual coating modules are not distinguished) of the same construction arranged vertically. Each coating module 8 includes a spin chuck 11 for suction-supporting and spinning a wafer W in horizontal posture, and a nozzle 12 for supplying a coating solution to the wafer W held on the spin chuck 11 for forming antireflection film.

As shown in FIG. 3, the antireflection film heat-treating modules 9 include a plurality of heating plates HP for heating wafers W to a predetermined temperature, a plurality of cooling plates CP for cooling the heated wafers W to room temperature, and a plurality of adhesion modules AHL for heat-treating the wafers W in an atmosphere of HMDS (hexamethyldisilazane) vapor in order to promote adhesion of the resist film to the wafers W. The heat-treating modules 9 further include a substrate rest PASS1 for receiving wafers W to transfer the wafers W between the indexer cell C1 and antireflection film forming cell C2, and a cooling plate CP_PASS serving to cool wafers W and to transfer wafers W between the indexer cell C1 and antireflection film forming cell C2. A heater controller (CONT) is disposed below these heat-treating modules 9, and piping, wiring and reserve spaces are allocated to positions above the heat-treating modules 9 (indicated by "X" mark in FIG. 3).

The cooling plate CP_PASS disposed below the substrate rest PASS1 is used to feed wafers W from the indexer cell C1 to the antireflection film forming cell C2. The substrate rest PASS1 is used to return wafers W from the antireflection film forming cell C2 to the indexer cell C1. As seen from the antireflection film forming cell C2, the cooling plate CP_PASS corresponds to an inlet substrate rest for letting wafers W into the antireflective film forming cell C2. Particularly where the transport direction of wafers W from the indexer cell C1 toward the exposing apparatus STP is regarded as a forward direction, the cooling plate CP_PASS corresponds to a feed inlet substrate rest used for transporting wafers W in the forward direction. On the other hand, the substrate rest PASS1 is an outlet substrate rest for letting wafers W out of the antireflective film forming cell C2, and in particular corresponds to a return outlet substrate rest used for transporting wafers W in a backward direction (in the first embodiment, the transport direction of wafers W from the exposing apparatus STP toward the indexer cell C1).

In the following description, unless otherwise stated, the cooling plate CP serves only to cool wafers W, while the cooling plate CP_PASS cools wafers W and transfers wafers W between the adjacent cells as well.

Each of the substrate rest PASS1 and cooling plate CP_PASS has a plurality of fixed support pins. This is the case also with other substrate rests PASS2-PASS5 and cooling plates CP_PASS in the other cells C3-C6 to be described hereinafter. The substrate rest PASS1 and cooling plate CP_PASS include optical sensors, not shown, for detecting wafers W. A detection signal of each sensor is used for determining whether the substrate rest PASS1 or cooling plate CP_PASS is in a state for transferring a wafer W to or from the indexer's transport mechanism 7 or the first main transport mechanism 10A of the antireflection film forming cell C2. Similar sensors are provided for the other substrate rests PASS2-PASS5 and cooling plates CP_PASS in the other cells C3-C6 also.

In the antireflection film heat-treating modules 9, these heat-treating modules HP, CP and AHL, including the substrate rest PASS1 and cooling plate CP_PASS, are stacked vertically. The other, resist film forming cell C3 and developing cell C4 also share the feature of the chemical treating modules and heat-treating modules stacked vertically.

The vertical arrangements of the chemical treating modules and the heat-treating modules in each of the treating cells C2-C4 have the effect of reducing the space occupied by the substrate treating apparatus.

As is clear from this description, the substrate rest PASS1 and cooling plate CP_PASS for transferring wafers W between the indexer cell C1 and antireflection film forming cell C2 are included in the heat-treating modules 9 arranged in multiple stages, and these substrate rest PASS1 and cooling plate CP_PASS are located adjacent and along the transport path of the indexer's transport mechanism 7. This arrangement no longer requires the substrate rests, as required in the prior art, for transfer of wafers W between the indexer and antireflection film forming unit. The substrate rest PASS1 may be disposed in the existing heat-treating modules, thereby reducing the space for installing the substrate rest (i.e. solution to problem (IV)).

The first main transport mechanism 10A will be described with reference to FIGS. 6A and 6B. The first main transport mechanism 10A has the same construction as the second, third and fourth main transport mechanisms 10B, 10C and 10D in the other, resist film forming cell C3, developing cell C4, post-exposure baking cell C5 and interface cell C6. The first to fourth main transport mechanisms 10A-10D will be referred to hereinafter as the main transport mechanism(s) 10 where these transport mechanisms are not distinguished.

Figure 6A:
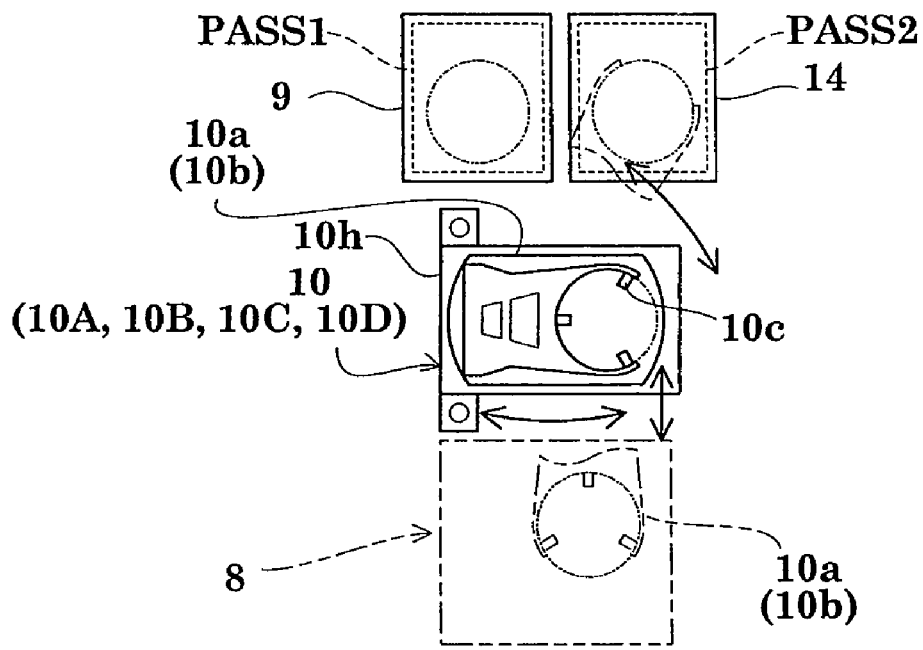
FIG. 6A is a plan view showing an outline of a main transport mechanism.
Figure 6B:
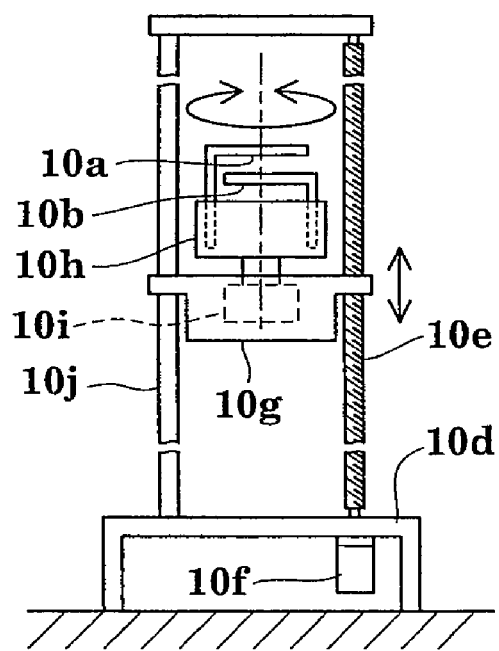
FIG. 6B is a left side view of the main transport mechanism shown in FIG. 6A.

FIG. 6A is a plan view of the main transport mechanism 10. FIG. 6B is a left side view thereof. The main transport mechanism 10 includes two holding arms 10a and 10b arranged vertically and close to each other for holding wafers W in horizontal posture. Each holding arm 10a or 10b has a forward end C-shaped in plan view, and a plurality of pins 10c projecting inwardly from inside the C-shaped end for supporting peripheries of wafer W from below. The main transport mechanism 10 has a base 10d fixed to a base of the apparatus. The base 10d rotatably supports a screw shaft 10e extending upward. A motor 10f is attached to the base 10d for rotating the screw shaft 10e. A lift deck 10g is meshed with the screw shaft 10e. When the motor 10f rotates the screw shaft 10e, the lift deck 10g moves vertically as guided by a guide rod 10j. An arm base 10h is mounted on the lift deck 10g to be rotatable about a vertical axis. A motor 10i is mounted in the lift deck 10g for rotating the arm base 10h. The two holding arms 10a and 10b noted above are arranged vertically on the arm base 10h. The holding arms 10a are 10b are extendible and retractable radially of rotation of the arm base 10h and independently of each other by drive mechanisms (not shown) mounted in the arm base 10h.

The resist film forming cell C3 will be described. The resist film forming cell C3 is a mechanism for forming photoresist film over the antireflection film formed on the wafers W. The first embodiment uses a chemically amplified resist as photoresist. The resist film forming cell C3 includes resist film coating modules 13 for applying and forming photoresist film on the wafers W coated with the antireflection film, resist film heat-treating modules 14 for heat-treating the wafers W in relation to formation of the photoresist film, and the second main transport mechanism 10B for transferring the wafers W to and from the resist film coating modules 13 and resist film heat-treating modules 14.

As shown in FIG. 2, the resist film coating modules 13 consist of three resist film coating modules 13a-13c (hereafter referenced "13" where the individual coating modules are not distinguished) of the same construction arranged vertically. Each coating module 13 includes a spin chuck 15 for suction-supporting and spinning a wafer W in horizontal posture, and a nozzle 16 for supplying a coating solution to the wafer W held on the spin chuck 15 for forming resist film.

Figure 4A:
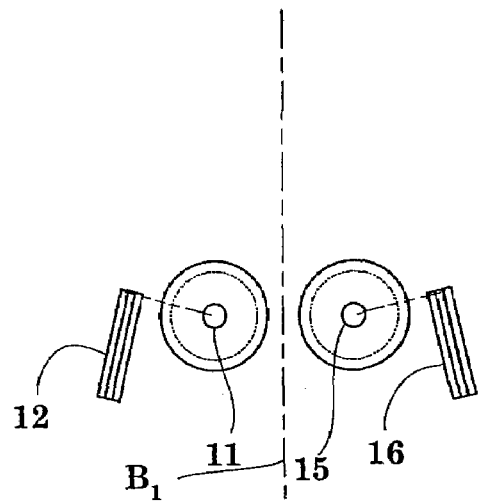
FIG. 4A is an explanatory view relating to a supply system, which is a plan view of nozzles and spin chucks.
Figure 4B:
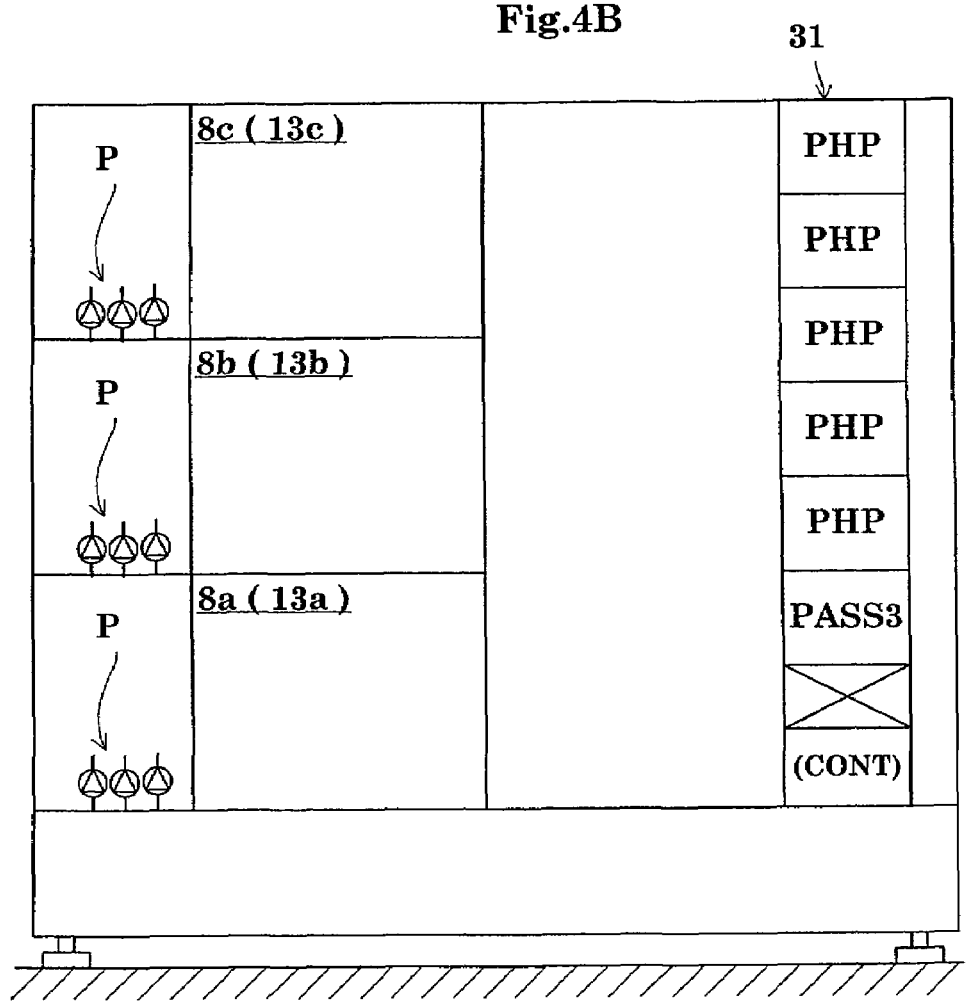
FIG. 4B an explanatory view relating to the supply system, which is a side view showing an outline of pumps arranged vertically.

FIGS. 4A and 4B are explanatory views relating to a supply system. FIG. 4A is a plan view of nozzles and spin chucks. FIG. 4B is a side view showing an outline of pumps arranged vertically. As shown in FIG. 4A, each resist film coating module 13 has the nozzle 16 disposed at the right-hand side of the spin chuck 15 (the side adjacent the developing cell C4), while each antireflection film coating module 8 described hereinbefore has the nozzle 12 disposed at the left-hand side of the spin chuck 11 (the side adjacent the indexer cell C1). The nozzles 12 and 16 are arranged outwardly and the spin chucks 11 and 15 inwardly with respect to a boundary line B1 between the antireflection film forming cell C2 and resist film forming cell C3. That is, the spin chucks 11 and 15 and the nozzles 12 and 16 are in a positional relationship symmetrical about the boundary line B1. This arrangement has an advantage over the prior art in avoiding interference between the first and second main transport mechanisms 10A and 10B and the nozzles 12 and 16, thereby facilitating transfer of wafers W to and from the spin chucks 11 and 15 by the first and second main transport mechanisms 10A and 10B (i.e. solution to problem (II)).

As shown in FIG. 3, the resist film heat-treating modules 14 include, in a left-hand column (adjacent the antireflection film forming cell C2), a plurality of heating plates HP for heating wafers W to a predetermined temperature, and a plurality of cooling plates CP for cooling the heated wafers W to room temperature with high precision. The same column includes a substrate rest PASS2 for receiving wafers W to transfer the wafers W between the antireflection film forming cell C2 and resist film forming cell C3, and a cooling plate CP_PASS serving to cool wafers W and to transfer the wafers W between the antireflection film forming cell C2 and resist film forming cell C3. Further, the resist film heat-treating modules 14 include, in a right-hand column (adjacent the resist film forming cell C3), a plurality of heating modules PHP, with temporary substrate deposits, for heating wafers W to a predetermined temperature. Thus, the heat-treating modules HP, CP and PHP, including the substrate rest PASS2 and cooling plate CP_PASS, are stacked vertically and in a plurality of columns (two columns in the first embodiment). The feature of vertically arranging the heat-treating modules is the same as in the antireflection film forming cell C2.

The cooling plate CP_PASS disposed below the substrate rest PASS2 is used to feed wafers W from the antireflection film forming cell C2 to the resist film forming cell C3. The substrate rest PASS2 is used to return wafers W from the resist film forming cell C3 to the antireflection film forming cell C2. The cooling plate CP_PASS, as seen from the antireflection film forming cell C2, corresponds to a feed outlet substrate rest, and as seen from the resist film forming cell C3, corresponds to a feed inlet substrate rest. The substrate rest PASS2, as seen from the antireflection film forming cell C2, corresponds to a return inlet substrate rest, and as seen from the resist film forming cell C3, corresponds to a return outlet substrate rest.

The vertically stacked groups of heat-treating modules in the plurality of columns juxtaposed with each other as described above, provide the advantages of facilitating maintenance of the heat-treating modules, and eliminating the need to extend, to a great height, ducting, piping and power supply lines required for the heat-treating modules.

Figure 7A:
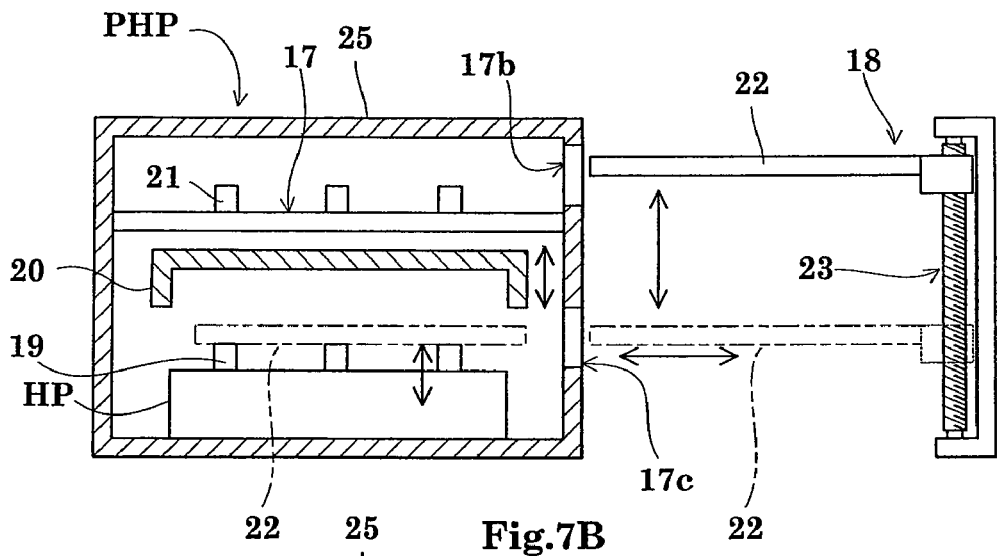
FIG. 7A is a sectional side view of a heating module with a temporary substrate deposit.
Figure 7B:
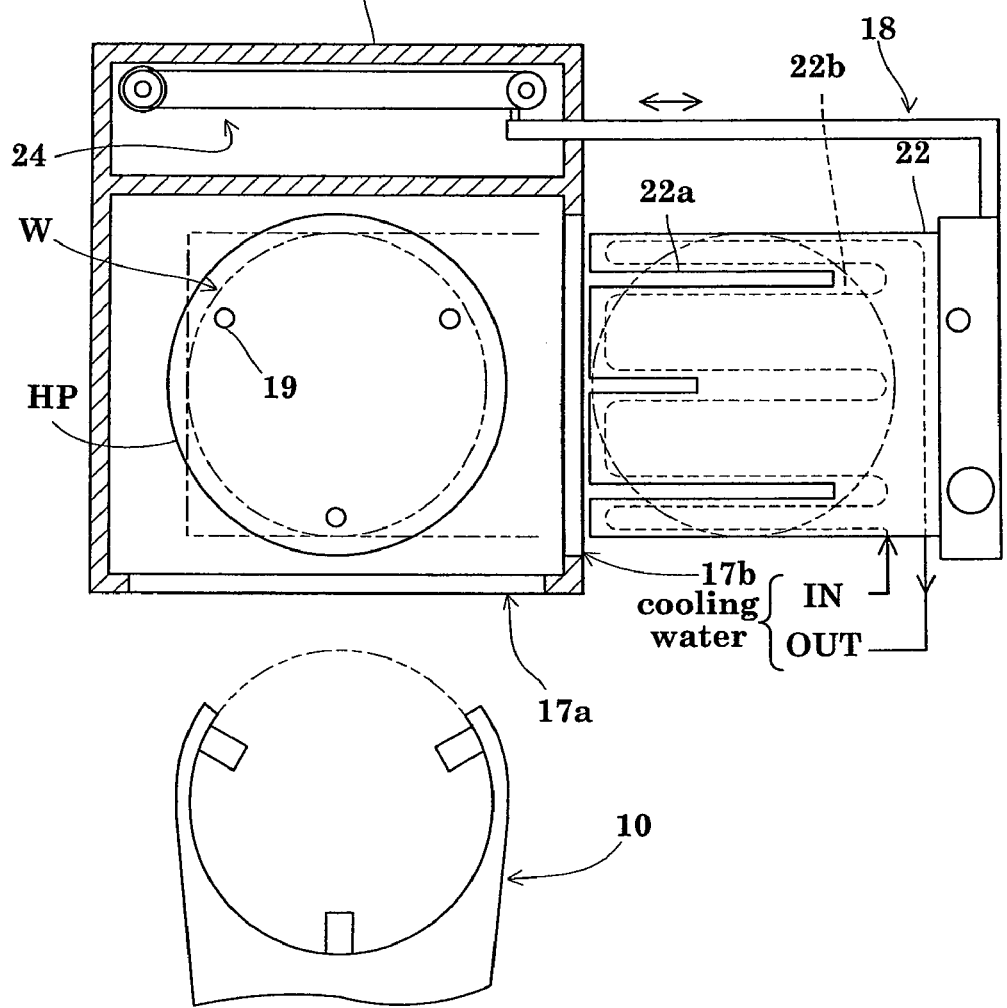
FIG. 7B is a sectional plan view of the heating module with the temporary wafer deposit.

The heating modules PHP with temporary substrate deposits will be described with reference to FIGS. 7A and 7B. FIG. 7A is a sectional side view of one of the heating modules PHP. FIG. 7B is a sectional plan view thereof. The heating module PHP includes a heating plate HP for heating a wafer W placed thereon, a temporary substrate deposit 17 for keeping the wafer W in an upper position or lower position (upper position in the first embodiment) away from the heating plate HP, and a local transport mechanism 18 for transporting the wafer W between the heating plate HP and temporary substrate deposit 17. The heating plate HP has a plurality of support pins 19 projectable above and retractable below the upper surface of the plate. An upper lid 20 is disposed above the heating plate HP to be vertically movable for covering the wafer W in time of heating treatment. The temporary substrate deposit 17 has a plurality of fixed support pins 21 for supporting the wafer W.

The local transport mechanism 18 includes a holding plate 22 for holding a wafer W in horizontal posture. The holding plate 22 is vertically movable by a screw feed mechanism 23, and extendible and retractable by a belt drive mechanism 24. The holding plate 22 defines a plurality of slits 22a to avoid interference with the movable support pins 19 or fixed support pins 21 when the holding plate 22 is extended over the heating plate HP or temporary substrate deposit 17. The local transport mechanism 18 includes a device for cooling a wafer W while transporting the wafer W from the heating plate HP to the temporary substrate deposit 17. This cooling device, for example, has a cooling water channel 22b formed inside the holding plate 22 for circulating cooling water.

The local transport mechanism 18 is opposed to the second main transport mechanism 10B across the heating plate HP and temporary substrate deposit 17. That is, the local transport mechanism 18 is disposed adjacent the rear surface of the apparatus. The heating plate HP and temporary substrate deposit 17 are enclosed in a housing 25. The housing 25 has an opening 17a formed in the front wall of an upper portion thereof covering the temporary substrate deposit 17 for allowing entry of the second main transport mechanism 101B and an opening 17b formed in a side wall of the upper portion for allowing entry of the local transport mechanism 18. Further, the housing 25 has a closed front surface in a lower portion thereof covering the heating plate HP, and an opening 17c formed in a side wall of the lower portion for allowing entry of the local transport mechanism 18.

As is clear from this description, the temporary substrate deposit 17 and heating plate HP, and the holding plate 22 movable to/from the temporary substrate deposit 17 and heating plate HP for loading and unloading action, are arranged in the forward and backward directions along the substrate transport path between the indexer cell C1 and exposing apparatus STP (see FIGS. 7A and 7B). Since the temporary substrate deposit 17, heating plate HP and holding plate 22 are not arranged perpendicular to the transport directions along the substrate transport path as in the prior art, space-saving is achieved in the direction perpendicular to the transport directions (i.e. solution to problem (III)). In the vacant space now made available, opposite the heating modules PHP across the substrate transport path, as shown in FIG. 4B, for example, supply systems such as pumps P may be provided individually for the antireflection film coating modules 8 and resist film coating modules 13 at the respective stages, and connected to the nozzles 12 of the antireflection film coating modules 8 and to the nozzles 16 of the resist film coating modules 13 (the connections not being shown). In this way, the pumps P and their connections may be arranged horizontally, to avoid the suck-up action being impaired by viscosity of the treating solutions (photoresist solution and antireflection film forming solution).

A wafer W is loaded into and unloaded from the above heating module PHP as follows. First, the main transport mechanism 10 (the second main transport mechanism 10B in the case of the resist film forming cell C3) places a wafer W on the fixed support pins 21 of temporary substrate deposit 17. Then, the holding plate 22 of the local transport mechanism 18 advances under the wafer W and slightly ascends to pick up the wafer W from the fixed support pins 21. The holding plate 22 holding the wafer W leaves the housing 25, and descends to a position opposed to the heating plate HP. At this time, the movable support pins 19 of the heating plate HP are in the lowered position, and the upper lid 20 is raised. The holding plate 22 holding the wafer W advances over the heating plate HP. The movable support pins 19 are raised to pick up the wafer W, and thereafter the holding plate 22 leaves the housing 25. Then, the movable support pins 19 are lowered to lay the wafer W on the heating plate HP. The upper lid 20 is lowered to cover the wafer W. The wafer W is heated in this state. After the heating treatment, the upper lid 20 is raised. The movable support pins 19 are raised to pick up the wafer W. The holding plate 22 advances under the wafer W, and then the movable support pins 19 are lowered to lay the wafer W on the holding plate 22. The holding plate 22 holding the wafer W leaves the housing 25, moves up and transports the wafer W into the temporary substrate deposit 17. The wafer W supported by the holding plate 22 in the temporary substrate deposit 17 is cooled by the cooling function of the holding plate 22. The holding plate 22 transfers the cooled (i.e. returned to room temperature) wafer W onto the fixed support pins 21 in the temporary substrate deposit 19. The main transport mechanism 10 takes out and transports the wafer W.

As described above, the main transport mechanism 10 transfers wafers W to and from the temporary substrate deposit 19 only, and not to and from the heating plate HP. Thus, the main transport mechanism 10 is free from temperature increase.

The developing cell will be described. The developing cell C4 is a mechanism for developing exposed wafers W. Specifically, the developing cell C4 includes developing modules 26 for developing exposed wafers W, two groups of heat-treating modules 27 and 28 for heat-treating the wafers W in relation to development, and the third main transport mechanism 10C for transferring the wafers W to and from the developing modules 26 and heat-treating modules 27 and 28.

As shown in FIG. 2, the developing modules 26 consist of six developing modules 26a-26f (hereafter referenced "26" where the individual developing modules are not distinguished) of the same construction arranged vertically and side by side. Each developing module 26 includes a spin chuck 29 for suction-supporting and spinning a wafer W in horizontal posture, and a nozzle 30 for supplying a developer to the wafer W held on the spin chuck 29.

In the antireflection film forming cell C2 and resist film forming cell C3, the chemical treating modules are arranged in the front area of the apparatus, while the heat-treating modules are arranged in the rear area of the apparatus. Thus, the chemical treating modules and heat-treating modules are opposed to each other across the main transport mechanism. In the developing cell C4, the heat-treating modules 27 are disposed to the left of the third main transport mechanism 10C (adjacent the resist film forming cell C3), while the heat-treating modules 28 are disposed to the right of the third main transport mechanism 10C (adjacent the interface cell C6). Thus, the heat-treating modules 27 and 28 are opposed to each other across the third main transport mechanism 10C.

As shown in FIG. 3, the heat-treating modules 27 include a plurality of cooling plates CP, and also two cooling plates CP_PASS serving to cool wafers W and to transfer the wafers W between the resist film forming cell C3 and developing cell C4.

Of the two cooling plates CP_PASS, the upper cooling plate CP_PASS is used to feed wafers W from the resist film forming cell C3 to the developing cell C4, and the lower cooling plate CP_PASS is used to return wafers from the developing cell C4 to the resist film forming cell C3. The upper cooling plate CP_PASS, as seen from the resist film forming cell C3, corresponds to a feed outlet substrate rest, and as seen from the developing cell C4, corresponds to a feed inlet substrate rest. The lower cooling plate CP_PASS, as seen from the resist film forming cell C3, corresponds to a return inlet substrate rest, and as seen from the developing cell C4, corresponds to a return outlet substrate rest.

As shown in FIG. 3, the heat-treating modules 28 include a plurality of heating plates HP, a plurality of cooling plates CP, and a cooling plate CP_PASS serving to cool wafers W and to transfer the wafers W between the developing cell C4 and post-exposure baking cell C5.

The cooling plate CP_PASS is used to feed wafers W from the developing cell C4 to the post-exposure baking cell C5. The cooling plate CP_PASS, as seen from the developing cell C4, corresponds to a feed outlet substrate rest, and as seen from the post-exposure baking cell C5, corresponds to a feed inlet substrate rest.

The post-exposure baking cell C5 will be described. The post-exposure baking cell C5 is a mechanism for heating exposed wafers W before development. Specifically, the post-exposure baking cell C5 includes heat-treating modules 31 for post-exposure bake for heating exposed wafers W before development, and a vertical stacking structure having two edge exposing modules EEW for exposing peripheries of wafers W coated with photoresist, a feed buffer SBF, a substrate return buffer RBF and substrate rests PASS4 and PASS5. The fourth main transport mechanism 10D is provided for transferring wafers W to and from the vertical stacking structure and the heat-treating modules 31 for post-exposure bake.

The heat-treating modules 31 include a plurality of heating modules PHP with temporary substrate deposits, and a substrate rest PASS3 for transferring wafers W between the developing cell C4 and post-exposure baking cell C5.

The substrate rest PASS3 is used to return wafers W from the post-exposure baking cell C5 to the developing cell C4. The substrate rest PASS3, as seen from the developing cell C4, corresponds to a return inlet substrate rest, and as seen from the post-exposure baking cell C5, corresponds to a return outlet substrate rest.

As shown in FIG. 2, each edge exposing module EEW includes a spin chuck 32 for suction-supporting and spinning a wafer W in horizontal posture, and a light emitter 33 for exposing peripheries the wafer W held on the spin chuck 36. The two edge exposing modules EEW are arranged one over the other. The fourth main transport mechanism 10D disposed adjacent the edge exposing modules EEW and heat-treating modules 31 for post-exposure bake has the same construction as the main transport mechanism 10 illustrated in FIGS. 6A and 6B.

Figure 5:
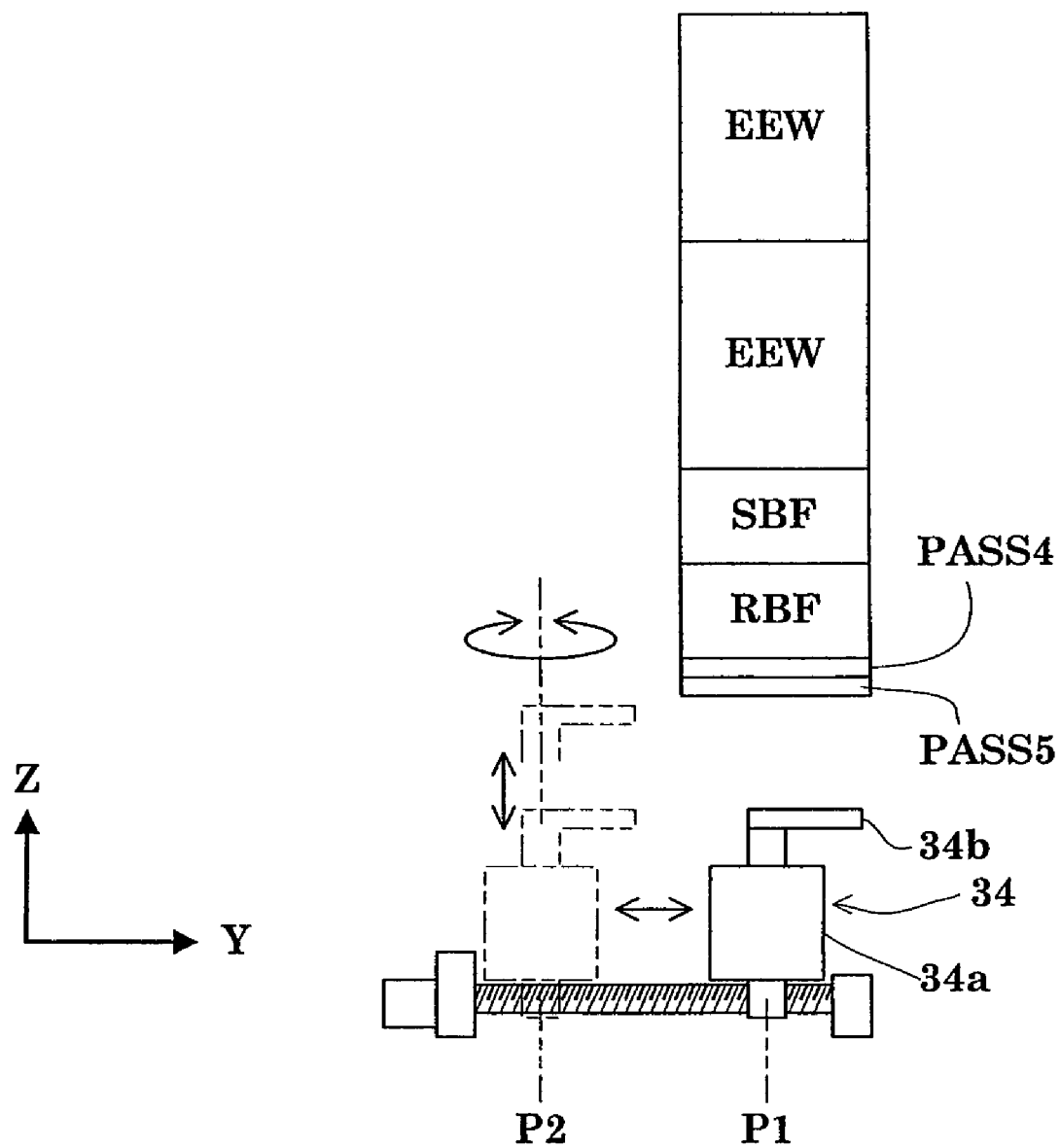
FIG. 5 is a side view showing an outline of edge exposing modules and an interface cell.

The edge exposing modules EEW and interface cell C6 will be described with reference to FIG. 5. FIG. 5 is a side view of the edge exposing modules EEW and interface cell C6. The feed buffer SBF and substrate return buffer RBF noted above are arranged below the two edge exposing modules EEW, and the two substrate rests PASS4 and PASS5 are arranged one over the other, below the buffer RBF. The feed buffer SBF is provided for temporarily storing wafers W to be exposed, when the exposing apparatus STP cannot accept the wafers W. The substrate return buffer RBF is provided for temporarily storing wafers W having undergone post-exposure baking treatment in the heating modules PHP included in the heat-treating modules 31 of the post-exposure baking cell C5 when the developing cell C4 cannot develop the wafers W due to some fault, for example. The feed buffer SBF and substrate return buffer RBF are each in the form of a storage rack for storing a plurality of wafers W in multiple stages.

The substrate rest PASS4 is used to feed wafers W from the post-exposure baking cell C5 to the interface cell C6. The substrate rest PASS5 is used to return wafers W from the interface cell C6 to the post-exposure baking cell C5. The substrate rest PASS4, as seen from the post-exposure baking cell C5, corresponds to a feed outlet substrate rest, and as seen from the interface cell C6, corresponds to a feed inlet substrate rest. The substrate rest PASS5, as seen from the post-exposure baking cell C5, corresponds to a return inlet substrate rest, and as seen from the interface cell C6, corresponds to a return outlet substrate rest.

The interface cell C6 is a mechanism for transferring wafers W to and from the exposing apparatus STP which is an external apparatus separate from the substrate treating apparatus. The interface cell C6 includes an interface's transport mechanism 34 for transferring wafers W to and from the exposing apparatus STP.

As shown in FIGS. 1 and 5, the interface's transport mechanism 34 has a movable base 34a for horizontal movement in Y-direction, and a holding arm 34b mounted on the movable base 34a for holding wafers W. The holding arm 34b is vertically movable, swingable, and extendible and retractable radially of the swinging movement. The interface's transport mechanism 34 has one end (position P1 shown in FIG. 5) of its transport path extending under the substrate rests PASS4 and PASS5 arranged vertically. In the position P1, the interface's transport mechanism 34 transfers wafers W to and from the exposing apparatus STP. In the other end position P2 of the transport path, the interface's transport mechanism 34 transfers wafers W to and from the substrate rests PASS4 and PASS5.

The substrate treating apparatus having the above construction feeds downflows of clean air into the indexer cell C1, respective treating cells C2-C5 and interface cell C6 to avoid adverse influences on the processes exerted by floating particles and air currents in these cells. The interior of each cell is maintained at a slightly higher pressure than external environment of the apparatus to prevent entry of particles, contaminants and the like from the external environment. The antireflection film forming cell C2, in particular, is set to a higher atmospheric pressure than the indexer cell C1. Since the atmosphere in the indexer cell C1 does not flow into the antireflection film forming cell C2, the treating processes may be carried out in the respective cells C2-C5 without being influenced by external atmosphere.

In the first embodiment, and also in the second and third embodiments described hereinafter, a treating cell for performing a required treatment of substrates, and a single main transport mechanism for transferring the substrates to and from the treating cell, constitute a single controlled unit. Such controlled units are juxtaposed to form the substrate treating apparatus. Each controlled unit includes, as distinguished from each other, an inlet substrate rest for placing incoming substrates thereon, and an outlet substrate rest for placing outgoing substrates thereon. The main transport mechanisms of the respective controlled units transfer substrates through the inlet substrate rests and outlet substrate rests. Each controlled unit includes a control device for controlling at least the substrate transfer operation of the main transport mechanism of each controlled unit. The control device of each controlled unit performs, independently of the other control devices, a series of controls relating to substrate transport including transfer of substrates to and from the treating cells and transfer of substrates to and from the substrate rests.

The above controlled units correspond to the respective cells C1-C6. FIG. 8 shows an arrangement of the cells constituting the control system of the apparatus in the first embodiment. Between the cells C1-C6 are partitions, not shown, for preventing thermal influences from the adjoining cells.

The apparatus in the first embodiment has the above six cells C1-C6 arranged in juxtaposition. Wafers W are transferred between the cells C1-C6 through the substrate rests PASS1-PASS10. In other words, each controlled unit (cell) in this invention includes a single main transport mechanism, and treating modules to and from which the main transport mechanism transfers wafers W received from a particular inlet substrate rest before placing the wafers W on a particular outlet substrate rest.

Figure 9:
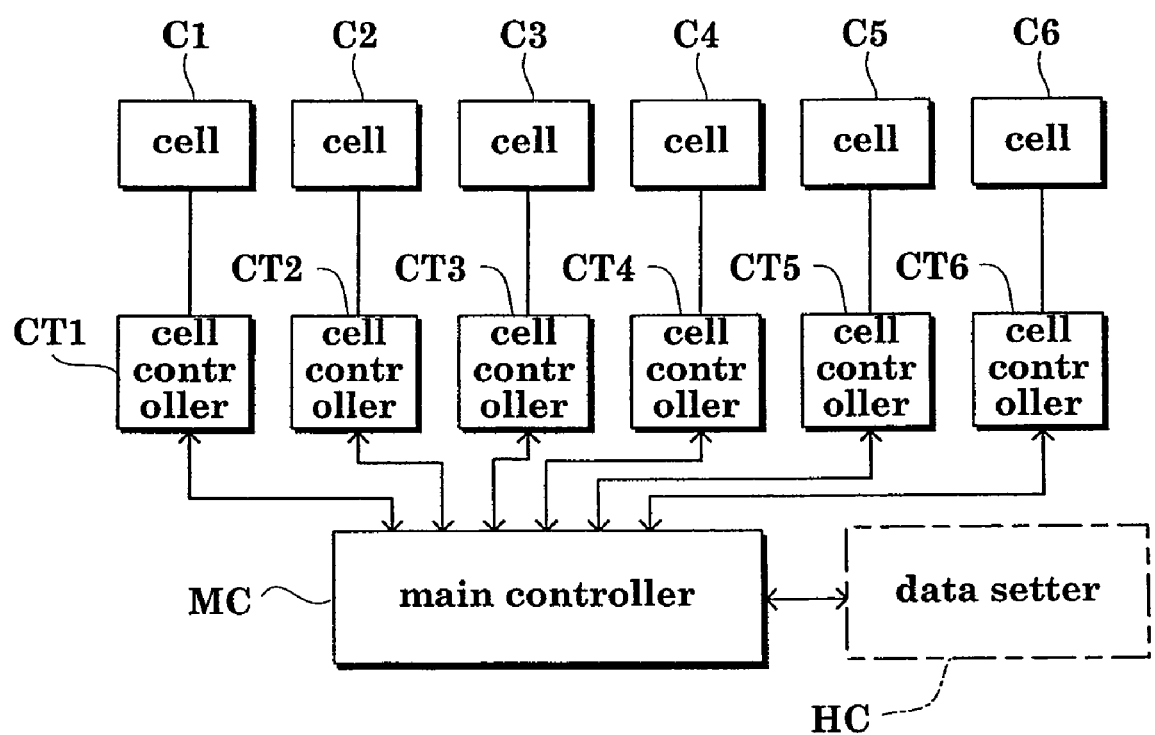
FIG. 9 is a block diagram of a control system in the apparatus in the first to third embodiments.

As shown in FIG. 9, the cells C1-C6 individually include cell controllers (unit control devices) CT1-CT6 for controlling at least substrate transfer operations of the main transport mechanisms (including the indexer's transport mechanism 7 and interface's transport mechanism 34), respectively. Each of the cell controllers CT1-CT6 independently performs a series of controls, starting with receipt of a wafer W from a predetermined inlet substrate rest, and finishing with placement of the wafer W on a predetermined outlet substrate rest. Specifically, the cell controllers CT1-CT6 of the respective cells C1-C6 exchange information in such a way that one controller sends information to the controller of a next cell that a wafer W has been placed on a predetermined substrate rest, and the cell controller of the next cell having received the wafer W returns information to the cell controller of the preceding cell that the wafer W has been received from the predetermined substrate rest. Such exchange of information is carried out through a main controller (main control device) MC connected to the respective cell controllers CT1-CT6 for performing an overall control thereof. The main controller MC is connected also to a data setter HC described hereinafter, for communication with the data setter HC.

Each of the cell controllers CT1-CT6 performs controls only for transfer of wafers W within its cell without regard to movement of the main transport mechanisms in the adjoining cells. Thus, the cell controllers CT1-CT6 operate under a reduced control load.

In the first embodiment, the controllers CT1-CT6 operate under a reduced control load as described above, and thus the substrate treating apparatus has correspondingly improved throughput. In the control method in the first embodiment, a cell may be added easily since it will not influence the adjoining cells. A cell that can be added is not limited to a particularly type. For example, an inspecting cell may be added between the resist film forming cell C3 and developing cell C4 for inspecting the thickness of resist film formed on wafers W or for inspecting the line width of developed resist film. In this case, the inspecting cell, as do the other cells in the first embodiment, includes substrate inspecting modules for inspecting substrates, and a main transport mechanism for transporting substrates to and from the inspecting modules. The substrates are transferred between the inspecting cell and adjacent cells through an inlet substrate rest and an outlet substrate rest.

Operation of the substrate treating apparatus in the first embodiment will be described next. See FIG. 10 particularly for the transport steps executed by the main transport mechanisms 10A-10D of the antireflection film forming cell C2, resist film forming cell C3, developing cell C4 and post-exposure baking cell C5.

First, the indexer's transport mechanism 7 of the indexer cell C1 moves horizontally to a position opposed to a predetermined cassette C. Then, a wafer W to be treated is fetched from the cassette C by vertically moving and extending and retracting the holding arm 7b. With the wafer W held by the holding arm 7b, the indexer's transport mechanism 7 moves horizontally to the position opposed to the substrate rest PASS1 and cooling plate CP_PASS of the antireflection film heat-treating modules 9. Then, the transport mechanism 7 places the wafer W held by the holding arm 7b on the lower, substrate feeding cooling plate CP_PASS. When a treated wafer W is found on the upper, return substrate rest PASS1, the indexer's transport mechanism 7 loads the treated wafer W on the holding arm 7b, and deposits this treated wafer W in a predetermined cassette C. Subsequently, the transport mechanism 7 repeats the operation to fetch a wafer W to be treated from the cassette C, transport the wafer W to the cooling plate CP_PASS, receive a treated wafer W from the substrate rest PASS1, and deposit the treated wafer W in the cassette C.

Figure 10:
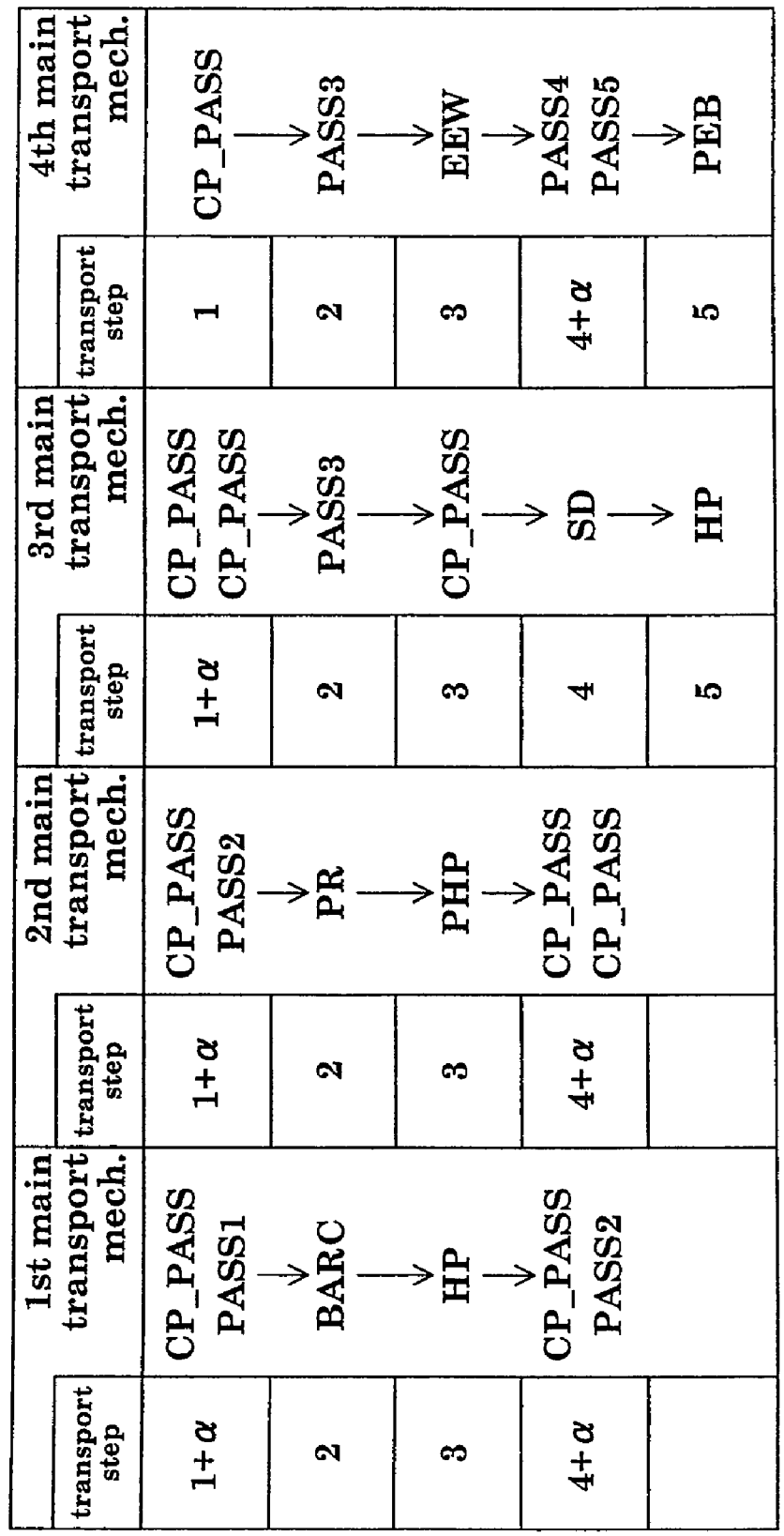
FIG. 10 is a view showing flows of substrate transport by first to fourth main transport mechanisms in the first embodiment.

Operation of the antireflection film forming cell C2 will be described. After a wafer W to be treated is placed on the cooling plate CP_PASS of the antireflection film heat-treating modules 9 ("feed inlet substrate rest" as seen from the antireflection film forming cell C2), as shown in FIG. 10, the first main transport mechanism 10A of the cell C2 vertically moves and swings the holding arms 10a and 10b together to the position opposed to the substrate rests PASS1 and cooling plate CP_PASS. Then, the first main transport mechanism 10A advances the holding arm 10a, and loads the holding arm 10a with the wafer W to be treated from the cooling plate CP_PASS. The holding arm 10a loaded with the wafer W is retracted to the original position. Next, the holding arms 10a and 10b are slightly raised together, and the holding arm 10b holding a treated wafer W is advanced to place the treated wafer W on the substrate rest PASS1 ("return outlet substrate rest" as seen from the antireflection film forming cell C2).

The above transfer of the wafer W to be treated and the treated wafer W to and from the substrate rest PASS1 and cooling plate CP_PASS is indicated by a transport step $(1+\alpha)$ of the first main transport mechanism 10A in FIG. 10. Here, "$\alpha$" represents the part of the transport step for slightly raising the holding arms 10a and 10b from the position opposed to the cooling plate CP_PASS to the position opposed to the substrate rest PASS1 in order to transfer the treated wafer W to the substrate rest PASS1. As noted hereinbefore, the substrate rest PASS1 and cooling plate CP_PASS are arranged vertically and close to each other. The time consumed in the movement between substrate rest PASS1 and cooling plate CP_PASS is brief and negligible. Thus, the transport step $(1+\alpha)$ may be regarded as one transport step (i.e. a substrate transfer operation carried out by the main transport mechanism within a predetermined time (e.g. four seconds) in the first embodiment).

Upon completion of the transfer of wafers W to and from the substrate rest PASS1 and cooling plate CP_PASS, the first main transport mechanism 10A vertically moves and swings together the holding arm 10a holding the wafer W to be treated and the holding arm 10b holding no wafer W to a position opposed to a predetermined one of the antireflection film coating modules 8. Usually, a prior-treated wafer W is present in this antireflection film coating module 8. Thus, the unloaded holding arm 10b is first advanced to pick up the treated wafer W from the spin chuck 11 in the antireflection film coating module 8. Then, the holding arm 10a holding the wafer W is advanced to place the wafer W on the spin chuck 11. The wafer W placed on the spin chuck 11 is coated with antireflection film while the main transport mechanism 10A performs other transport operations. The transfer of wafers W to and from the spin chuck 11 corresponds to transport step (2) of the first main transport mechanism 10A shown in FIG. 10. The "BARC" in FIG. 10 indicates the antireflection film coating module 8.

Upon completion of the transfer of wafers W to and from the spin chuck 11, the first main transport mechanism 10A vertically moves and swings together the holding arm 10a holding no wafer W and the holding arm 10b holding the wafer W coated with antireflection film to a position opposed to a predetermined heating plate HP. Usually, a prior-treated wafer W is present also on this heating plate HP. Thus, the unloaded holding arm 10a is first advanced to pick up the heated wafer W from the heating plate HP. Then, the holding arm 10b is advanced to place the wafer W to be treated on the heating plate HP. The wafer W placed on the heating plate HP is heat-treated to have superfluous solvent removed from the antireflection film on the wafer W while the main transport mechanism 10A performs other transport operations. The transfer of wafers W to and from the heating plate HP corresponds to transport step (3) of the first main transport mechanism 10A shown in FIG. 10.

Upon completion of the transfer of wafers W to and from the heating plate HP, the first main transport mechanism 10A vertically moves and swings together the holding arm 10a holding the heated wafer W and the unloaded holding arm 10b to a position opposed to the substrate rest PASS2 and cooling plate CP_PASS of the resist film heat-treating modules 14. The holding arm 10a holding the wafer W is advanced to place the wafer W on the cooling plate CP_PASS ("feed outlet substrate rest" as seen from the antireflection film forming cell C2). The wafer W placed on the cooling plate CP_PASS is cooled to room temperature with high precision while the main transport mechanism 10A performs other transport operations. Usually, the upper, substrate rest PASS2 ("return inlet substrate rest" as seen from the antireflection film forming cell C2) is holding a developed wafer W sent thereto from the developing cell C4 through the resist film forming cell C3. After slightly raising the holding arms 10a and 10b together, the unloaded holding arm 10b is advanced to pick up the developed wafer W from the substrate rest PASS2.

The transfer of wafers W to and from the substrate rest PASS2 and cooling plate CP_PASS corresponds to the transport step $(4+\alpha)$ of the first main transport mechanism 10A shown in FIG. 10. As noted hereinbefore, "$\alpha$" represents the brief part of the transport step for slightly raising and lowering the holding arms 10a and 10b. Thus, the transport step $(4+\alpha)$ may be regarded as one transport step.

The first main transport mechanism 10A of the antireflection film forming cell C2 repeats the transport step $(1+\alpha)$ through transport step $(4+\alpha)$ described above. As is clear from the foregoing description, wafers W heated by the heating plates HP are always held by the upper holding arm 10a. Since the thermal influence of heated wafers W extends strongly upward, the lower holding arm 10b is restrained from temperature increase under the influence of the heated wafers W. Although the holding arm 10a having undergone the thermal influence is used to feed wafers W from the antireflection film forming cell C2 to the next, resist film forming cell C3, the wafers W are fed through the cooling plate CP_PASS to be cooled to room temperature while the main transport mechanism 10A performs other transport operations. Thus, the wafers W are free from the thermal influence when received by the resist film forming cell C3. Consequently, temperature variations are suppressed for the wafers W undergoing the resist film coating treatment.

Operation of the resist film forming cell C3 will be described. After a wafer W coated with antireflection film is placed on the cooling plate CP_PASS ("feed inlet substrate rest" as seen from the resist film forming cell C3), as shown in FIG. 10, the second main transport mechanism 10B of cell C3 loads the wafer W from the cooling plate CP_PASS on the holding arm 10a, as in the case of the first main transport mechanism 10A described hereinbefore. Then, the second main transport mechanism 10B advances the holding arm 10b holding a developed wafer W to place the developed wafer W on the substrate rest PASS2 ("return outlet substrate rest" as seen from the resist film forming cell C3). The transfer of wafers W to and from the substrate rest PASS2 and cooling plate CP_PASS is indicated by a transport step $(1+\alpha)$ of the second main transport mechanism 10B in FIG. 10. As noted hereinbefore, "α" represents a negligible time, and the transport step (1+α) may be regarded as one transport step.

Upon completion of the transfer of wafers W to and from the substrate rest PASS2 and cooling plate CP_PASS, the second main transport mechanism 10B moves the holding arm 10a holding the wafer W and the holding arm 10b holding no wafer W to a position opposed to a predetermined one of the resist film coating modules 13. The unloaded holding arm 10b is first advanced to pick up a treated wafer W from the spin chuck 15 in the resist film coating module 13. Then, the holding arm 10a holding the wafer W is advanced to place the wafer W on the spin chuck 15. The wafer W placed on the spin chuck 15 is coated with resist film while the main transport mechanism 10B performs other transport operations. The transfer of wafers W to and from the spin chuck 15 corresponds to transport step (2) of the second main transport mechanism 10B shown in FIG. 10. The "PR" in FIG. 10 indicates the resist film coating module 13.

Upon completion of the transfer of wafers W to and from the spin chuck 15, the second main transport mechanism 10B moves the holding arm 10a holding no wafer W and the holding arm 10b holding the wafer W coated with resist film to a position opposed to a predetermined heating module PHP with temporary substrate deposit 17. The unloaded holding arm 10a is first advanced to pick up a treated wafer W from the temporary substrate deposit 17 of the heating module PHP. Then, the holding arm 10b is advanced to place the wafer W to be treated on the temporary substrate deposit 17. While the main transport mechanism 10B performs other transport operations, the local transport mechanism 18 transfers the wafer W placed on the temporary substrate deposit 17 to the heating plate HP in the heating module PHP for heat treatment. The wafer W heat-treated on the heating plate HP is returned to the temporary substrate deposit 17 by the same local transport mechanism 18. The wafer W is returned to the temporary substrate deposit 17 as held by the holding plate 22 of the local transport mechanism 18, and is cooled by the cooling mechanism in the holding plate 22. The transfer of wafers W to and from the heating module PHP corresponds to transport step (3) of the second main transport mechanism 10B shown in FIG. 10.

Upon completion of the transfer of wafers W to and from the heating module PHP, the second main transport mechanism 10B moves the holding arm 10a holding the heated wafer W and the unloaded holding arm 10b to a position opposed to the cooling plates CP_PASS of the heat-treating modules 27 for development. The holding arm 10a holding the wafer W is advanced to place the wafer W on the upper cooling plate CP_PASS ("feed outlet substrate rest" as seen from the resist film forming cell C3). The wafer W placed on the upper cooling plate CP_PASS is cooled to room temperature with high precision while the main transport mechanism 10B performs other transport operations. Then, the unloaded holding arm 10b is advanced to pick up a developed wafer W from the lower cooling plate CP_PASS ("return inlet substrate rest" as seen from the resist film forming cell C3).

The transfer of wafers W to and from the cooling plates CP_PASS corresponds to the transport step (4+α) of the second main transport mechanism 10B shown in FIG. 10. The transport step (4+α) is regarded as one transport step. The second main transport mechanism 10B of the resist film forming cell C3 repeats the transport step (1+α) through transport step (4+α) described above.

Operation of the developing cell C4 will be described. After a wafer W coated with resist film is placed on the upper cooling plate CP_PASS of the heat-treating modules 27 ("feed inlet substrate rest" as seen from the developing cell C4), as shown in FIG. 10, the third main transport mechanism 10C of cell C4 loads the wafer W from the cooling plate CP_PASS on the holding arm 10b. Then, the third main transport mechanism 10C advances the arm 10a holding a developed wafer W, and places the wafer W on the lower cooling plate CP_PASS ("return outlet substrate rest" as seen from the developing cell C4).

The transfer of wafers W to and from the cooling plates CP_PASS is indicated by transport step (1+α) of the third main transport mechanism 10C in FIG. 10.

Upon completion of the transfer of wafers W to and from the cooling plates CP_PASS, the third main transport mechanism 10C moves the holding arm 10a holding no wafer W and the holding arm 10b holding the wafer W to a position opposed to the substrate rest PASS3 of the heat-treating modules 31 for post-exposure bake. Then, the unloaded holding arm 10a is advanced to pick up a wafer W having undergone post-exposure baking treatment from the substrate rest PASS3 ("return inlet substrate rest" as seen from the developing cell C4). The receipt of wafer W from the substrate rest PASS3 corresponds to transport step (2) of the third main transport mechanism 10C shown in FIG. 10.

Upon completion of the receipt of wafer W from the substrate rest PASS3, the third main transport mechanism 10C moves the holding arms 10a and 10b, both holding wafers W, to a position opposed to the cooling plate CP_PASS of the heat-treating modules 28. Then, the arm 10b holding the wafer W is advanced to place the wafer W on the cooling plate CP_PASS ("feed outlet substrate rest" as seen from the developing cell C4). The wafer W placed on the cooling plate CP_PASS is cooled to room temperature with high precision while the main transport mechanism 10C performs other transport operations. The transfer of wafer W to the cooling plate CP_PASS corresponds to transport step (3) of the third main transport mechanism 10C shown in FIG. 10.

Upon completion of the transfer of wafer W to the cooling plate CP_PASS, the third main transport mechanism 10C moves the holding arm 10a holding the wafer W and the unloaded holding arm 10b to a position opposed to a predetermined one of the developing modules 26. The unloaded holding arm 10b is first advanced to pick up a treated wafer W from the spin chuck 29 in the developing module 26. Then, the holding arm 10a holding the wafer W is advanced to place the wafer W on the spin chuck 29. The wafer W placed on the spin chuck 29 is developed while the main transport mechanism 10C performs other transport operations. The transfer of wafers W to and from the spin chuck 29 corresponds to transport step (4) of the third main transport mechanism 10C shown in FIG. 10. The "SD" in FIG. 10 indicates the developing module 26.

Upon completion of the transfer of wafers W to and from the spin chuck 29, the third main transport mechanism 10C moves the unloaded holding arm 10a and the holding arm 10b holding the developed wafer W to a position opposed to a predetermined heating plate HP. The unloaded holding arm 10a is first advanced to pick up a treated wafer W from the heating plate HP. Then, the holding arm 10b is advanced to place the wafer W on the heating plate HP. The wafer W placed on the heating plate HP is heat-treated while the third main transport mechanism 10C performs other transport operations. The transfer of wafers W to and from the heating plate HP corresponds to transport step (5) of the third main transport mechanism 10C shown in FIG. 10. The third main transport mechanism 10C of the developing cell C4 repeats the transport step (1+α) through transport step (5) described above.

Operation of the post-exposure baking cell C5 will be described. After a wafer W coated with resist film is placed on the cooling plate CP_PASS of the heat-treating modules 28 for development ("feed inlet substrate rest" as seen from the post-exposure baking cell C5), as shown in FIG. 10, the fourth main transport mechanism 10D of cell C5 loads the wafer W from the cooling plate CP_PASS on the holding arm 10b. The receipt of wafer W from the cooling plate CP_PASS corresponds to transport step (1) of the fourth main transport mechanism 10D in FIG. 10.

Upon completion of the receipt of wafer W from the cooling plate CP_PASS, the fourth main transport mechanism 10D moves the holding arm 10a holding a wafer W having undergone post-exposure baking treatment and the holding arm 10b holding the wafer W coated with resist film to a position opposed to the substrate rest PASS3 of the heat-treating modules 31 for post-exposure bake. Then, the holding arm 10a is advanced to place the wafer W on the substrate rest PASS3 ("return inlet substrate rest" as seen from the post-exposure baking cell C5). The transfer of wafer W to the substrate rest PASS3 corresponds to transport step (2) of the fourth main transport mechanism 10D shown in FIG. 10.

Upon completion of the transfer of wafer W to the substrate rest PASS3, the unloaded holding arm 10a and the holding arm 10b holding the wafer W are moved to a position opposed to a predetermined one of the edge exposing modules EEW. The unloaded holding arm 10a is first advanced to pick up an edge-exposed wafer W from the spin chuck 32 in the edge exposing module EEW. Then, the holding arm 10a holding the wafer W is advanced to place the wafer W to be treated on the spin chuck 32. The wafer W placed on the spin chuck 32 has peripheries thereof exposed while the main transport mechanism 10D performs other transport operations. The transfer of wafers W to and from the spin chuck 32 corresponds to transport step (3) of the fourth main transport mechanism 10D shown in FIG. 10.

Upon completion of the transfer of wafers W to and from the spin chuck 32, the fourth main transport mechanism 10D moves the holding arm 10a holding the edge-exposed wafer W and the unloaded holding arm 10b to a position opposed to the substrate rests PASS4 and PASS5. Then, the holding arm 10a holding the wafer W is advanced to place the wafer W on the substrate rest PASS4 ("return outlet substrate rest" as seen from the post-exposure baking cell C5), and the unloaded holding arm 10b is advanced to pick up a wafer W exposed in the exposing apparatus STP from the substrate rest PASS5 ("return inlet substrate rest" as seen from the post-exposure baking cell C5). The transfer of wafers W to and from the substrate rests PASS4 and PASS5 corresponds to transport step (4+α) of the fourth main transport mechanism 10D shown in FIG. 10.

Upon completion of the transfer of wafers W to and from the substrate rests PASS4 and PASS5, the fourth main transport mechanism 10D moves the unloaded holding arm 10a and the holding arm 10b holding the exposed wafer W to a position opposed to a predetermined heating module PHP, with a temporary substrate deposit, of the heat-treating modules 31. The unloaded holding arm 10a is first advanced to pick up an exposed and heated wafer W from the heating module PHP (more particularly from the temporary substrate deposit 17). Then, the holding arm 10b is advanced to place the exposed wafer W in the heating module PHP (more particularly on the temporary substrate deposit 17). While the main transport mechanism 10D performs other transport operations, the local transport mechanism 18 transfers the wafer W placed on the temporary substrate deposit 17 to the heating plate HP for heat treatment. Subsequently, the heated wafer W is returned to the temporary substrate deposit 17 by the same local transport mechanism 18. The transfer of wafers W to and from the heating module PHP corresponds to transport step (5) of the fourth main transport mechanism 10D shown in FIG. 10. The "PEB" in FIG. 10 indicates the heating module PHP of the heat-treating modules 31 for post-exposure bake.

The fourth main transport mechanism 10D of the post-exposure baking cell C5 repeats the transport steps (1) through (5) described above.

Operation of the interface cell C6 will be described. After an edge-exposed wafer W is placed on the substrate rest PASS4 ("feed inlet substrate rest" as seen from the interface cell C6), the transport mechanism 34 of the interface cell C6 receives the wafer W from the substrate rest PASS4, and passes the wafer W on to the adjoining exposing apparatus STP. Furthermore, the interface's transport mechanism 34 receives an exposed wafer W from the exposing apparatus STP, and places this wafer W on the substrate rest PASS5 ("return outlet substrate rest" as seen from the interface cell C6). The interface's transport mechanism 34 repeats this substrate transport operation.

In the substrate treating apparatus in the first embodiment, as described above, the respective cells C1-C6 transport wafers W, under control of the controllers CT1-CT6, by using the main transport mechanisms 10 (however, the indexer cell C1 uses the indexer's transport mechanism 7, and the interface cell C6 the interface's transport mechanism 34). The two adjoining cells exchange information on substrate transport, only indicating that a wafer has been placed on a substrate rest PASS, and that the wafer W has been received. That is, each cell performs substrate transport within itself and independently without monitoring states of substrate transport in the adjoining cells. Thus, the cells do not necessarily deliver wafers W at the same time, but with certain time lags. However, such time lags are absorbed by varied lengths of time for which the wafers W are kept on the substrate rests provided for transferring the wafers W between the adjoining cells. The time lags in the substrate transfer between the adjoining cells never impede the substrate transport.

According to the first embodiment, therefore, the controllers CT1-CT6 have a reduced load of controlling the cells C1-C6, whereby the substrate treating apparatus provides a correspondingly improved throughput, and has a correspondingly simplified construction. A substrate inspecting cell including substrate inspecting modules and a main transport mechanism may easily be installed between appropriate cells, which renders the substrate treating apparatus highly flexible. Further, where the apparatus includes a cell of less transport steps than the other cells, new treating modules (e.g. substrate inspecting modules) may easily be added to this cell without affecting the other cells.

Where a chemically amplified resist is used as photoresist, wafers W need to be heated promptly after exposure. Thus, exposed wafers W are promptly transported to the heating modules PHP of the heat-treating modules 31 to receive post-exposure baking treatment. When, because of some fault, the developing cell C4 is incapable of developing wafers W, exposed wafers W are loaded in the substrate return buffer RBF for temporary storage.

Figure 11A:
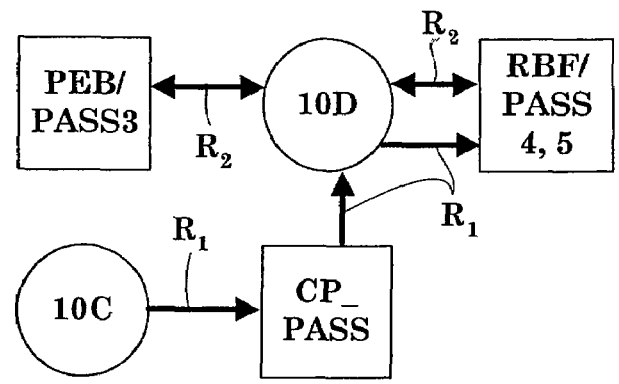
FIG. 11A is a plan view schematically showing substrate transport paths in the first embodiment.

Substrate transport paths for transporting wafers W between different treating modules may be regarded as having a plurality of main transport mechanisms (including the indexer's transport mechanism 7 and interface's transport mechanism 34), with transfer points (e.g. substrate rests and cooling plates) interposed for transferring the wafers W. As schematically shown in the plan view of FIG. 11A, for example, a substrate transport path $R_1$ for transporting wafers W in the forward direction to the exposing apparatus STP (i.e. a path exclusive to the forward direction) includes, as arranged in the stated order adjacent the developing cell C4 and post-exposure baking cell C5, the third main transport mechanism 10C, cooling plate CP_PASS of the heat-treating modules 28 for development (transfer point), fourth main transport mechanism 10D and substrate return buffer RBF (temporary substrate rest). On the other hand, the arrangement of a predetermined, fourth main transport mechanism D interposed between the substrate return buffer RBF and the heating modules PHP of the heat-treating modules 31 for post-exposure bake ("PEB" in FIG. 11A) may be regarded as a PEB-only substrate transport path $R_2$ for transporting wafers W between the buffer RBF and heating modules PHP as shown in FIG. 11A. It will be appreciated that, although partly in duplication, the forward direction-only path $R_1$ and PEB-only substrate transport path $R_2$ form different substrate transport paths. The forward direction-only path $R_1$ corresponds to the first substrate transport path in this invention. The PEB-only substrate transport path $R_2$ corresponds to the second substrate transport path in this invention.

With the PEB-only substrate transport path $R_2$ (second substrate transport path) provided separately from the forward direction-only path $R_1$ (first substrate transport path) as described above, wafers W may be transported along the two transport paths $R_1$ and $R_2$ independently of each other. The arrangement of the predetermined, fourth main transport mechanism D interposed between the substrate return buffer RBF (temporary substrate rest) for temporarily storing wafers W and the heating modules PHP at transfer points forms the PEB-only substrate transport path $R_2$ for transporting wafers W between the buffer RBF and heating modules PHP. Thus, post-exposure baking treatment is performed smoothly in the heating modules PHP. That is, post-exposure heating may be carried out promptly after exposure. Similarly, wafers W may be transported smoothly to the buffer RBF (i.e. solution to problem (I)).

In the first embodiment, the forward direction-only path $R_1$ and PEB-only substrate transport path $R_2$ partly overlap each other. The substrate transport path for transporting wafers W in the backward direction after receiving the wafers W from the exposing apparatus STP (backward direction-only path) and the PEB-only substrate transport path $R_2$ overlap each other in all parts. That is, these substrate transport paths are identical. Therefore, when a wafer W having received post-exposure baking treatment is transported to the buffer RBF because of a fault in the developing modules, wafers W transported in the backward direction could cause a waiting time on the wafer W having received post-exposure baking treatment. In this case, a construction described in the following third embodiment is desirable. That is, the PEB-only substrate transport path $R_2$ is constructed not to overlap the backward direction-only path. Of course, a construction may be provided where the forward direction-only path and PEB-only substrate transport path overlap each other in all parts, and the backward direction-only path and PEB-only substrate transport path form different transport paths.

It is desirable to construct the PEB-only substrate transport path R2 to extend through a cooling plate CP also. With such a construction, cooling treatment may be carried out smoothly after post-exposure baking treatment.

Second Embodiment

Next, the second embodiment of this invention will be described with reference to the drawings.

Figure 12:
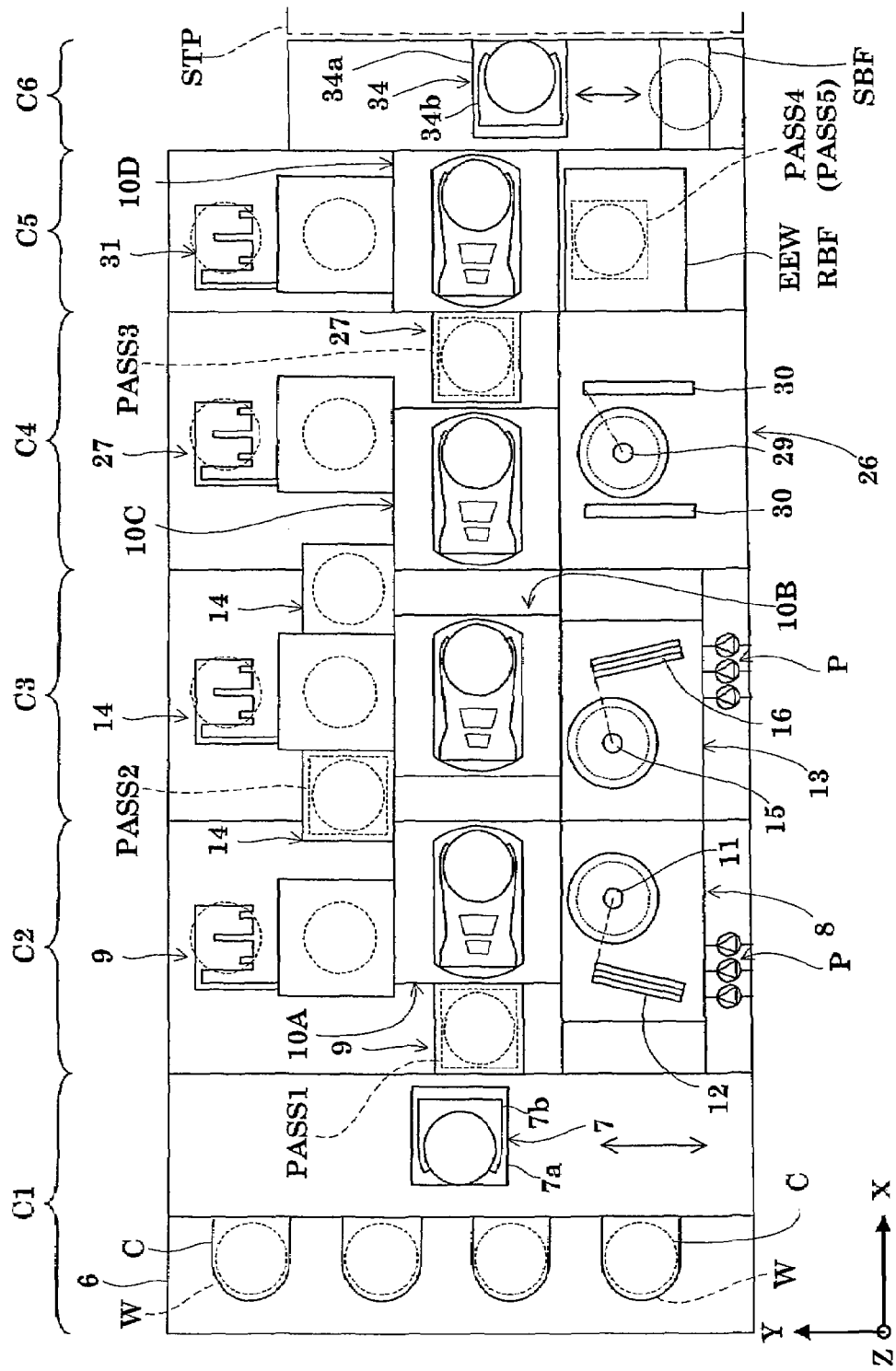
FIG. 12 is a plan view showing an outline of a substrate treating apparatus in the second embodiment.
Figure 13:
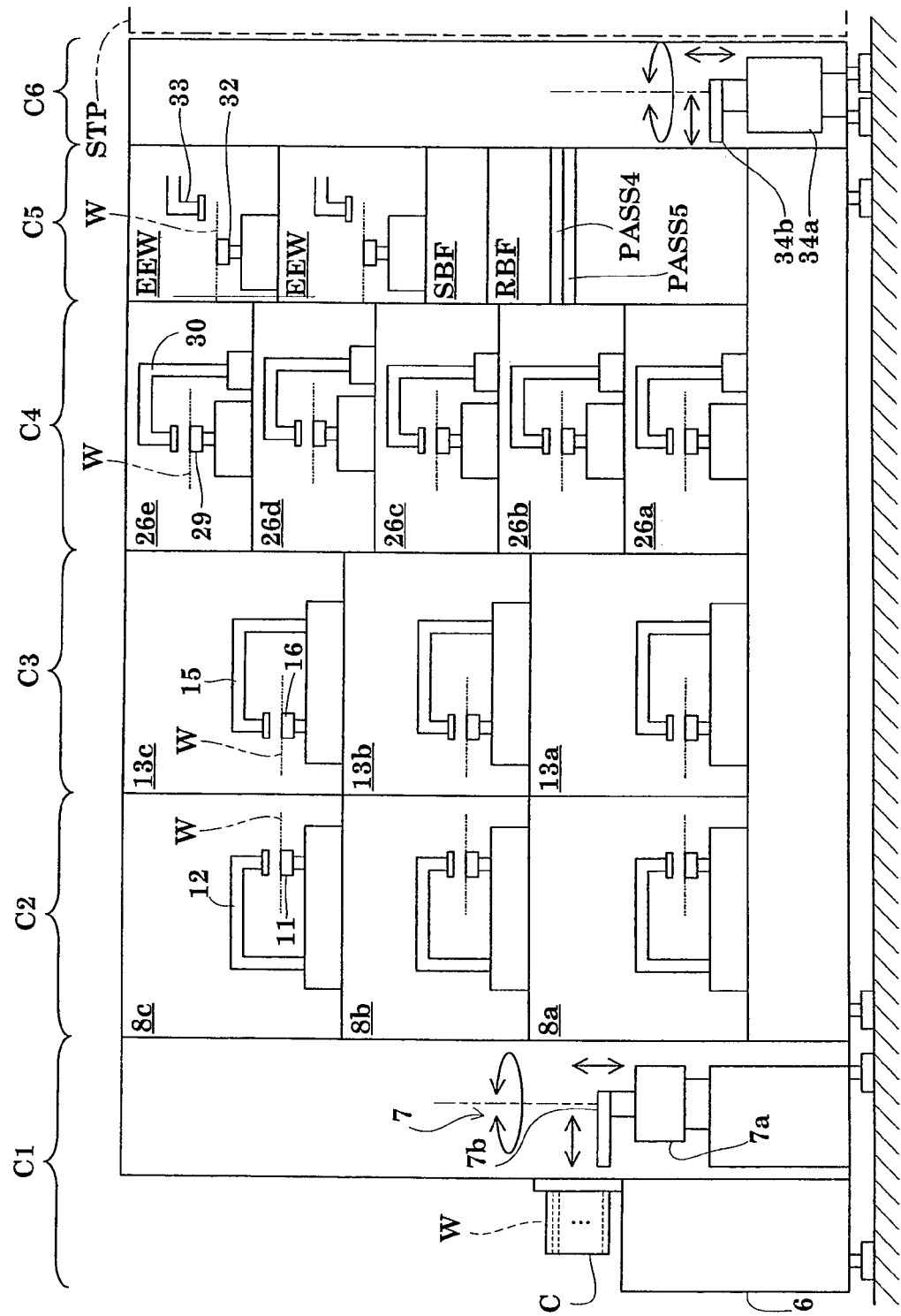
FIG. 13 is a front view showing an outline of the apparatus in the second embodiment.
Figure 14:
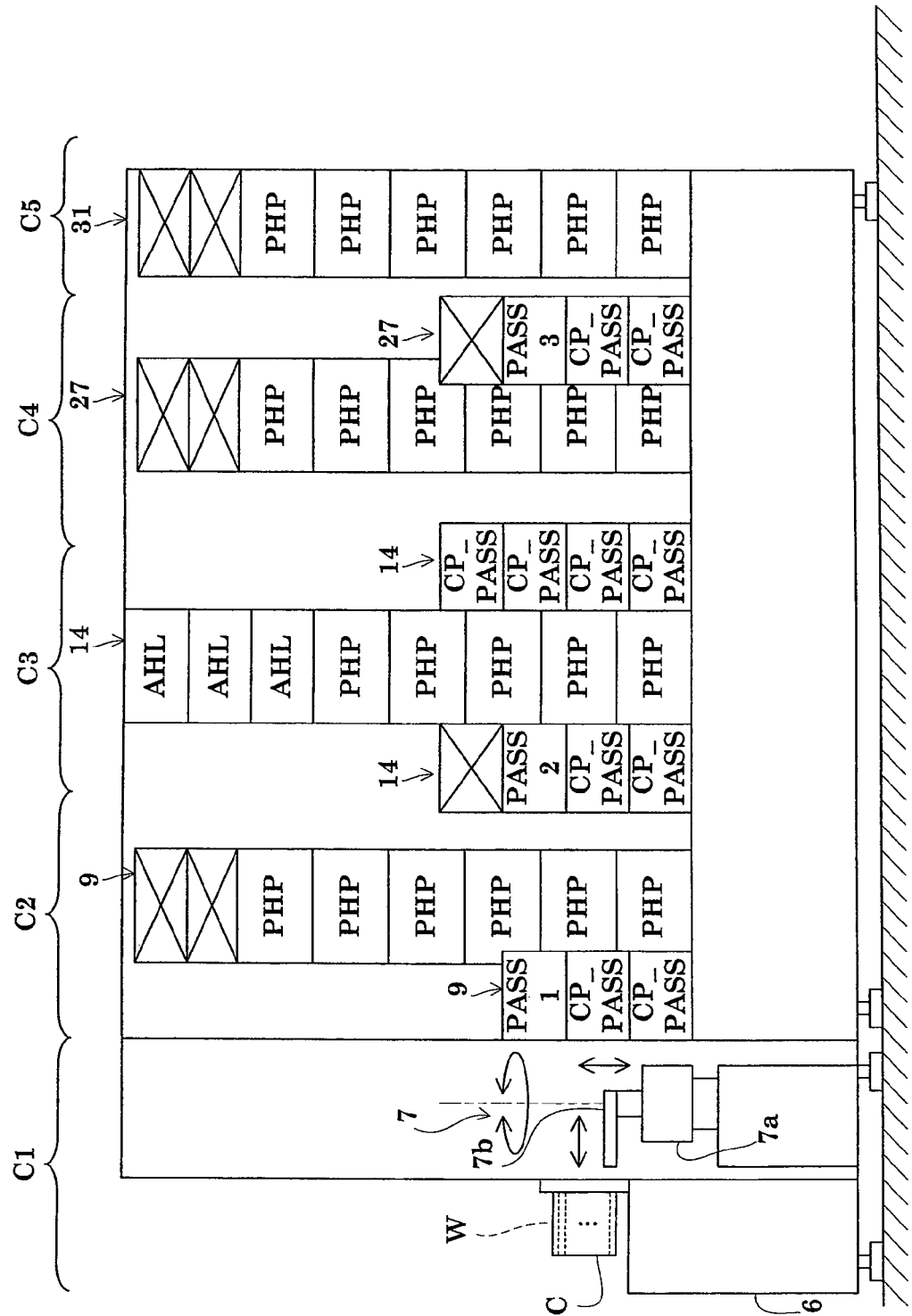
FIG. 14 is a front view of heat-treating modules.
Figure 15:
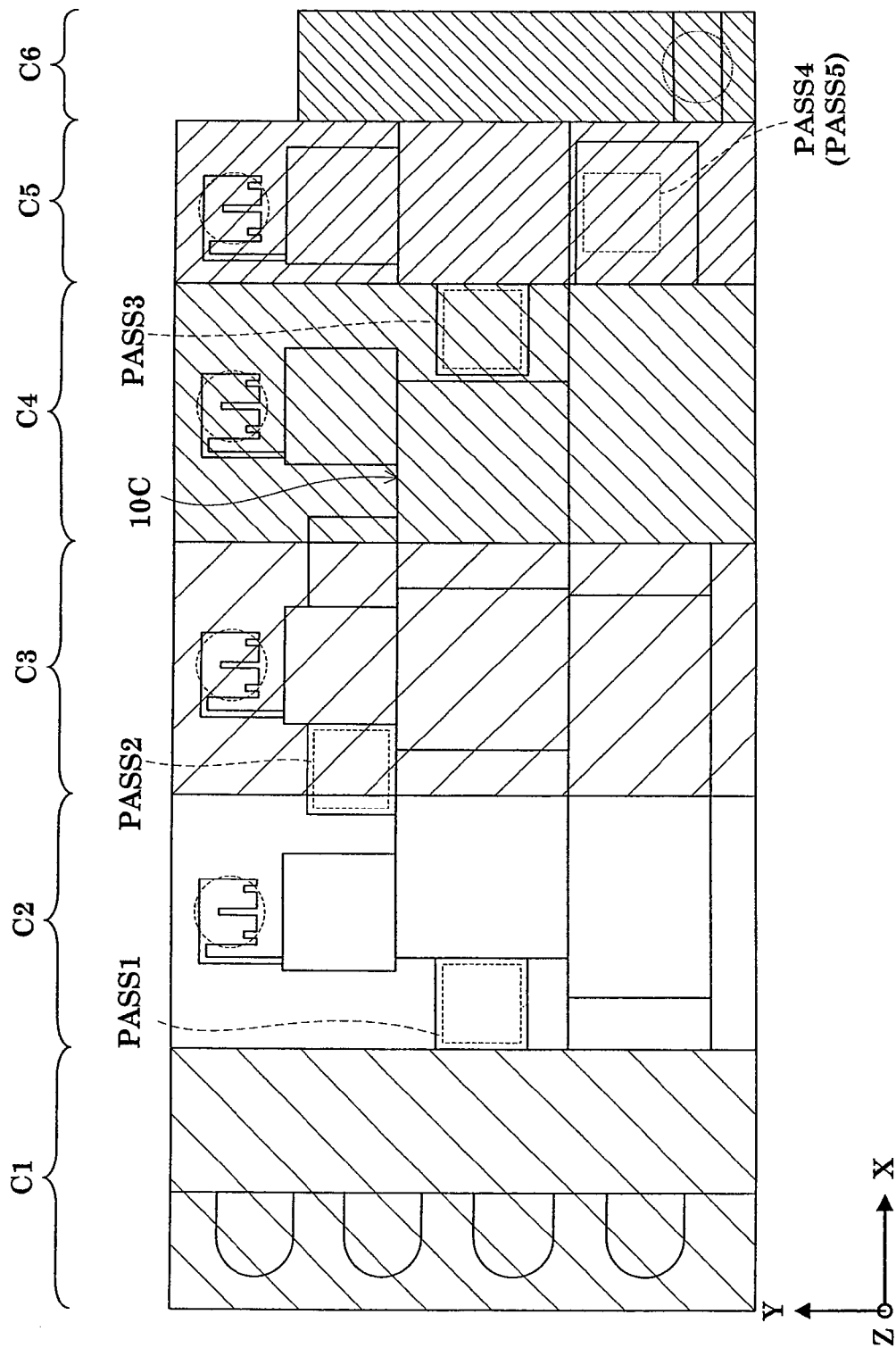
FIG. 15 is a plan view showing an arrangement of cells in the apparatus in the second embodiment.
Figure 16:
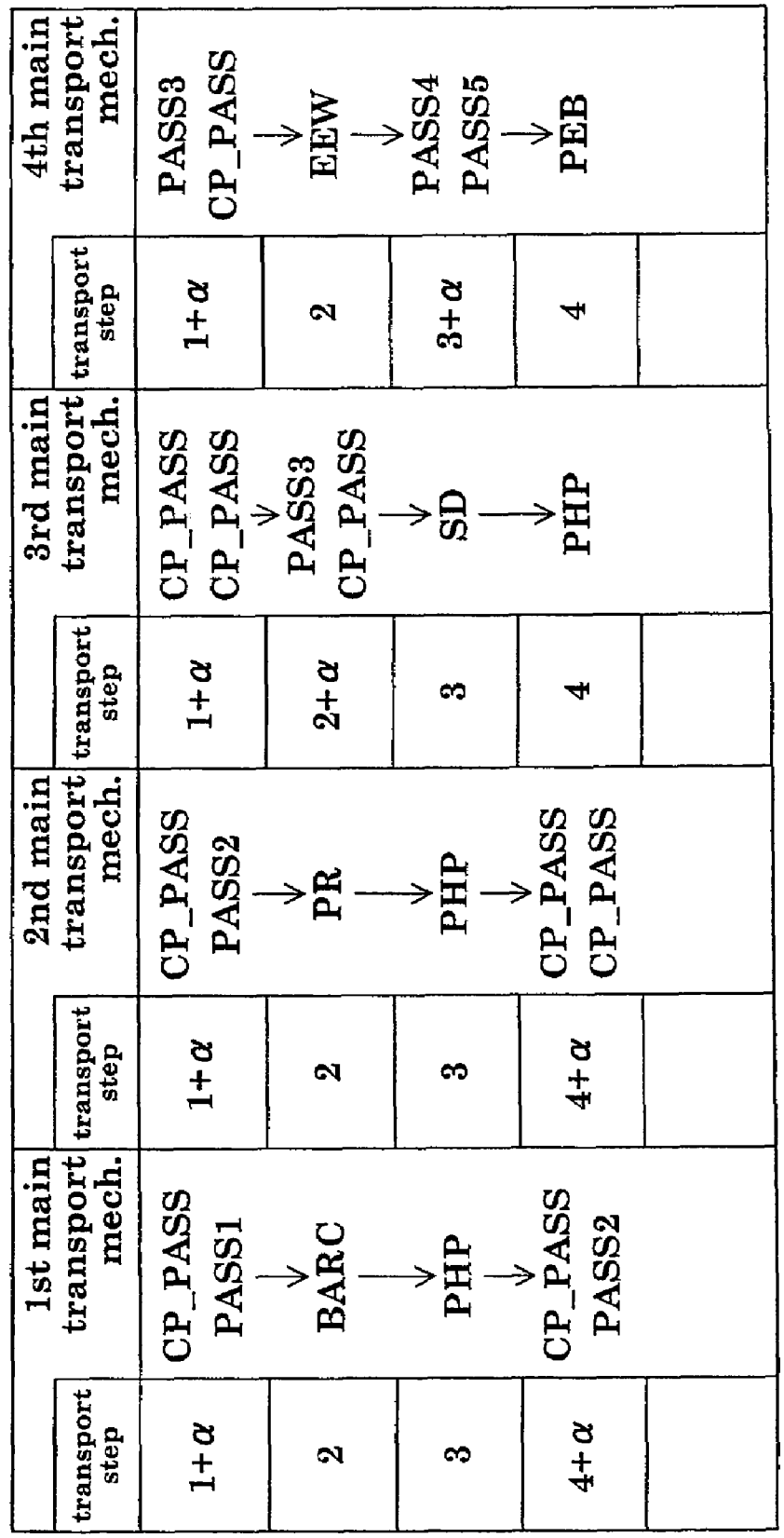
FIG. 16 is a view showing flows of substrate transport by first to fourth main transport mechanisms in the second embodiment.

FIG. 12 is a plan view of a substrate treating apparatus in the second embodiment. FIG. 13 is a front view thereof. FIG. 14 is a front view of heat-treating modules. FIG. 15 is a plan view showing an arrangement of cells in the apparatus. FIG. 16 is a view showing flows of substrate transport by first to fourth main transport mechanisms.

The substrate treating apparatus in the second embodiment has cells C1-C6 arranged as shown in FIGS. 12 and 15.

The antireflection film forming cell C2 in the second embodiment includes antireflection film coating modules 8, two groups of antireflection film heat-treating modules 9, and a first main transport mechanism 10A. The antireflection film coating modules 8 and one group of antireflection film heat-treating modules 9 are opposed to each other across the first main transport mechanism 10A. The other group of antireflection film heat-treating modules 9 is juxtaposed with the first main transport mechanism 10A in the forward/backward directions along the substrate transport path. As shown in FIG. 14, the antireflection film heat-treating modules 9 opposed to the antireflection film coating modules 8 include heating modules PHP, with temporary substrate deposits, stacked vertically. The antireflection film heat-treating modules 9 juxtaposed with the first main transport mechanism 10A include a substrate rest PASS1 and cooling plates CP_PASS stacked vertically. In the second embodiment, the cooling plates CP_PASS serve as substrate rests for feeding wafers W from the indexer cell C to the antireflection film forming cell C2. The substrate rest PASS1 serves to return wafers W from the antireflection film forming cell C2 to the indexer cell C1.

The resist film forming cell C3 includes resist film coating modules 13, three groups of resist film heat-treating modules 14, and a second main transport mechanism 10B. Two groups of resist film heat-treating modules 14 arranged in outer positions in the cell C3 have a substrate rest PASS2, cooling plates CP_PASS and cooling plates CP stacked vertically. The group of resist film heat-treating modules 14 in the middle has adhesion modules AHL and heating modules PHP stacked vertically. The cooling plates CP_PASS adjacent the antireflection film forming cell C2 serve as substrate rests for feeding wafers W from the antireflection film forming cell C2 to the resist film forming cell C3. The substrate rest PASS2 serves to return wafers W from the resist film forming cell C3 to the antireflection film forming cell C2. One of the cooling plates CP_PASS adjacent the developing cell C4 serves as a substrate rest for feeding wafers W from the resist film forming cell C3 to the developing cell C4, and the other as a substrate rest for returning wafers W from the developing cell C4 to the resist film forming cell C3.

The developing cell C4 includes developing modules 26, two groups of heat-treating modules 27 for development, and a third main transport mechanisms 10C. The developing modules 26 and one group of heat-treating modules 27 are opposed to each other across the third main transport mechanisms 10C. The other group of heat-treating modules 27 is juxtaposed with the third main transport mechanism 10C in the forward/backward directions along the substrate transport path. The heat-treating modules 27 opposed to the developing modules 26 include heating modules PHP stacked vertically. The heat-treating modules 27 juxtaposed with the third main transport mechanism 10C include a substrate rest PASS3 and cooling plates CP_PASS stacked vertically. The cooling plates CP_PASS serve as substrate rests for feeding wafers W from the developing cell C4 to the post-exposure baking cell C5. The substrate rest PASS3 serves to return wafers W from the post-exposure baking cell C5 to the developing cell C4.

The post-exposure baking cell C5 includes heat-treating modules 31 for post-exposure bake, edge exposing modules EEW, a substrate return buffer RBF, substrate rests PASS4 and PASS5, and a fourth main transport mechanism 10D. The heat-treating modules 31 for post-exposure bake include heating modules PHP stacked vertically. A feed buffer SBF is disposed in the interface cell C6. The substrate rest PASS4 serves to feed wafers W from the post-exposure baking cell C5 to the interface cell C6. The substrate rest PASS5 serves to return wafers W from the interface cell C6 to the post-exposure baking cell C5.

As is clear from this construction, the heat-treating modules are thermally divided into heating treatment and cooling treatment, and wafers W are transported obliquely with respect to the substrate transport path through the treating modules relating to the cooling treatment (in this case, the cooling modules CP_PASS acting also as substrate rests). With this arrangement, it is unnecessary to provide substrate rests between the cells, to reduce the space for installing the substrate rests. It is also unnecessary to take thermal influences into consideration (i.e. solution to problem (V)).

The heating modules (in this case, the heating modules PHP with temporary substrate deposits) and cooling modules (in this case, the cooling modules CP_PASS) acting also as substrate rests are thermally divided. Each cell has the heating modules arranged with the chemical treating modules (the antireflection film coating modules 8, resist film coating modules 13 or developing modules 26) in a direction parallel to the transport direction in the indexer cell C1 (i.e. across the substrate transport path between the cells). The cooling modules acting also as substrate rests are arranged between the cells. Thus, the chemical treatment and heating treatment are performed appropriately in each cell, and wafers W may be cooled in the course of transfer between the cells (i.e. solution to problem (VI)).

The transport steps executed by the main transport mechanisms 10A-10D in the second embodiment are shown in FIG. 16. Specifically, the first main transport mechanism 10A of the antireflection film forming cell C2 transfers wafers W to and from the cooling plate CP_PASS and substrate rest PASS1 of the antireflection film heat-treating modules 9, transfers wafers W to and from the spin chuck 11 of an antireflection film coating module 8, transfers wafers W to and from a heating module PHP, and transfers wafers W to and from the substrate rest PASS2 and cooling plate CP_PASS of the resist film heat-treating modules 14.

The second main transport mechanism 10B of the resist film forming cell C3 transfers wafers W to and from the substrate rest PASS2 and cooling plate CP_PASS of the resist film heat-treating modules 14, transfers wafers W to and from the spin chuck 15 of a resist film coating module 13, transfers wafers W to and from a heating module PHP, and transfers wafers W to and from a cooling plate CP_PASS of the resist film heat-treating modules 14.

The third main transport mechanism 10C of the developing cell C4 transfers wafers W to and from the cooling plate CP_PASS of the resist film heat-treating modules 14, transfers wafers W to and from the substrate rest PASS3 and cooling plate CP_PASS of the heat-treating modules 27 for development, transfers wafers W to and from the spin chuck 29 of a developing module 26, and transfers wafers W to and from a heating module PHP.

The fourth main transport mechanism 10D of the post-exposure baking cell C5 transfers wafers W to and from the substrate rest PASS3 and cooling plate CP_PASS of the heat-treating modules 27 for development, transfers wafers W to and from an edge exposing module EEW, transfers wafers W to and from the substrate rests PASS4 and PASS5, and transfers wafers W to and from a heating module PHP.

Figure 11B:
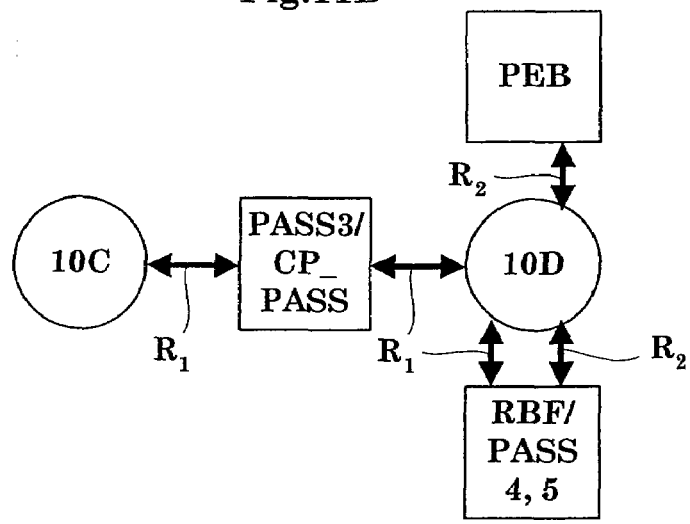
FIG. 11B is a plan view schematically showing substrate transport paths in the second embodiment.

From the construction of FIG. 12 and the transport steps described above, it will be understood that, as shown in FIG. 11B, the same transport path $R_1$ is used as a substrate transport path for transporting wafers W in the forward direction to the exposing apparatus STP (i.e. a path exclusive to the forward direction) and as a substrate transport path for transporting wafers W in the backward direction after receiving the wafers W from the exposing apparatus STP (i.e. a path exclusive to the backward direction). This transport path $R_1$ and a PEB-only substrate transport path $R_2$ form different substrate transport paths. Specifically, the substrate transport path $R_1$ includes, as arranged in the stated order or in the order reversed therefrom adjacent the developing cell C4 and post-exposure baking cell C5, the third main transport mechanism 10C, substrate rest PASS3 and cooling plate CP_PASS, fourth main transport mechanism 10D and substrate return buffer RBF (temporary substrate rest). On the other hand, the PEB-only substrate transport path $R_2$ includes the heating modules PHP, fourth main transport mechanism 10D and buffer RBF arranged in order. The transport path, in particular, between the heating modules PHP and fourth main transport mechanism 10D does not overlap the substrate transport path $R_1$.

In the second embodiment, the same main transport mechanism (in this case, the fourth main transport mechanism 10D) is shared by the substrate transport path $R_1$ and the PEB-only substrate transport path $R_2$. Further, as in the first embodiment, the transport paths $R_1$ and $R_2$ partly overlap each other, and as noted in the first embodiment, when a wafer W having received post-exposure baking treatment is transported to the buffer RBF because of a fault in the developing modules, wafers W transported in the backward direction could cause a waiting time on the wafer W having received post-exposure baking treatment. In this case, a construction described in the following third embodiment is desirable.

Third Embodiment

Next, the third embodiment of this invention will be described with reference to the drawings.

Figure 17:
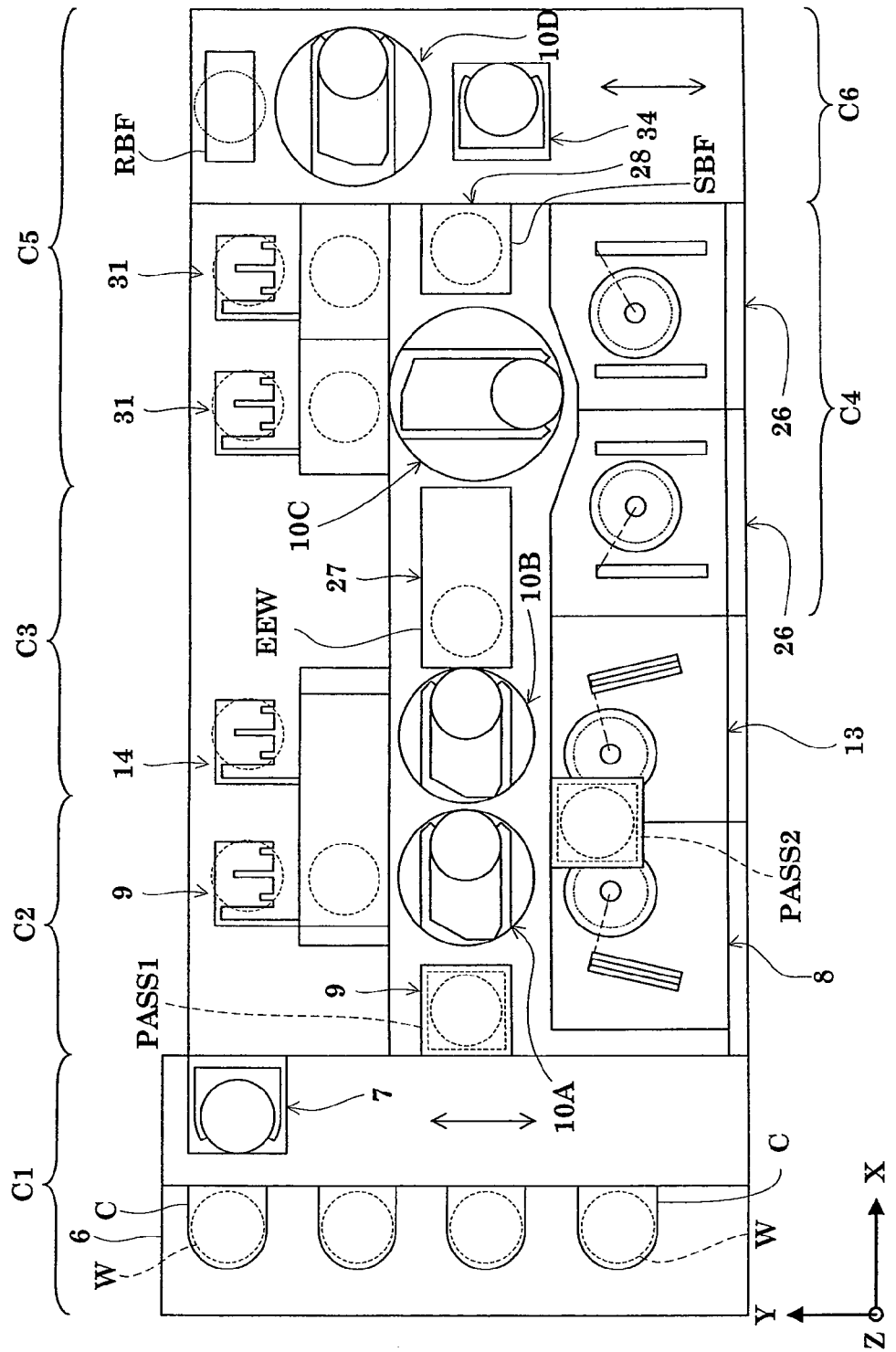
FIG. 17 is a plan view showing an outline of a substrate treating apparatus in the third embodiment.
Figure 18:
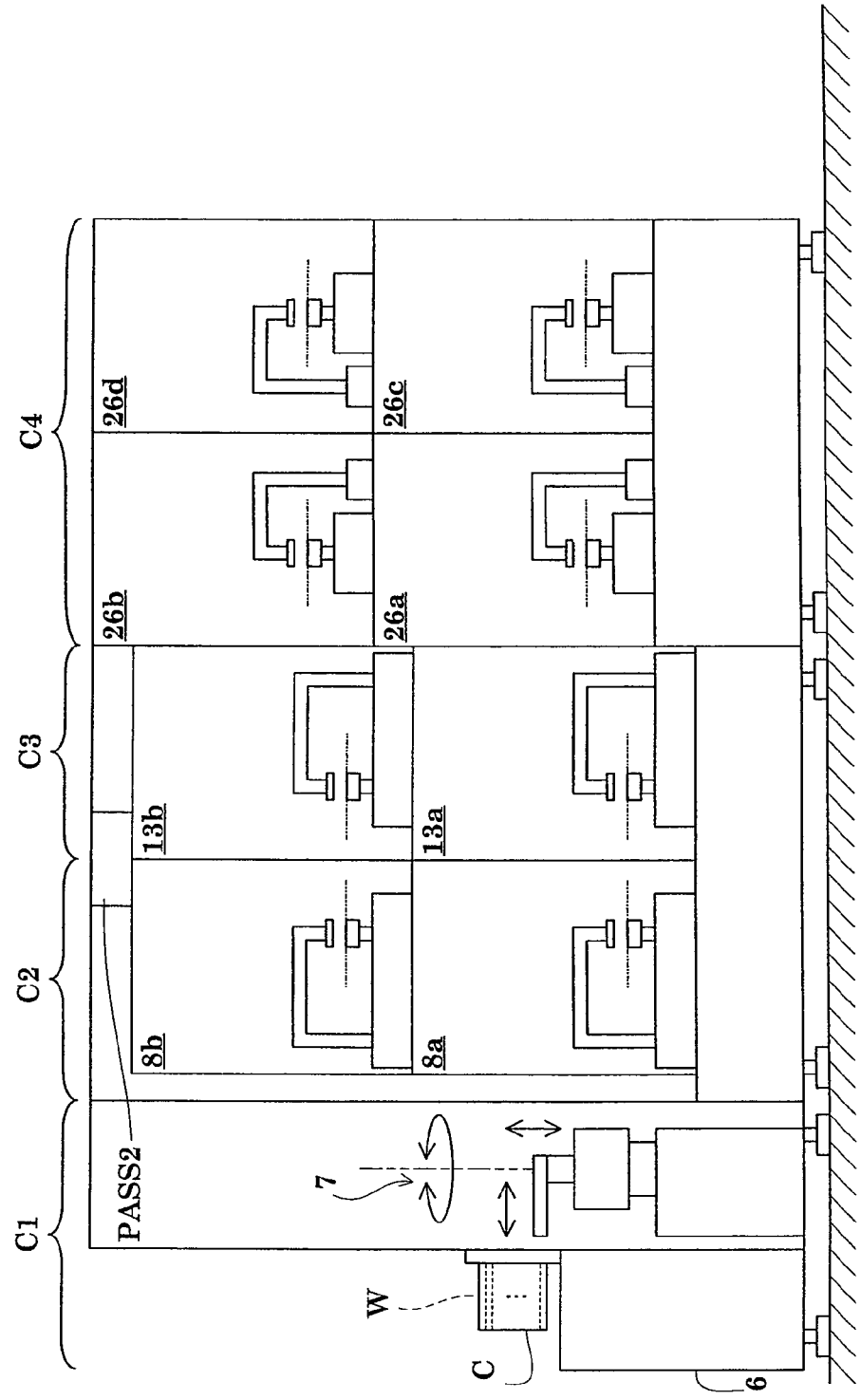
FIG. 18 is a front view showing an outline of the apparatus in the third embodiment.
Figure 19:
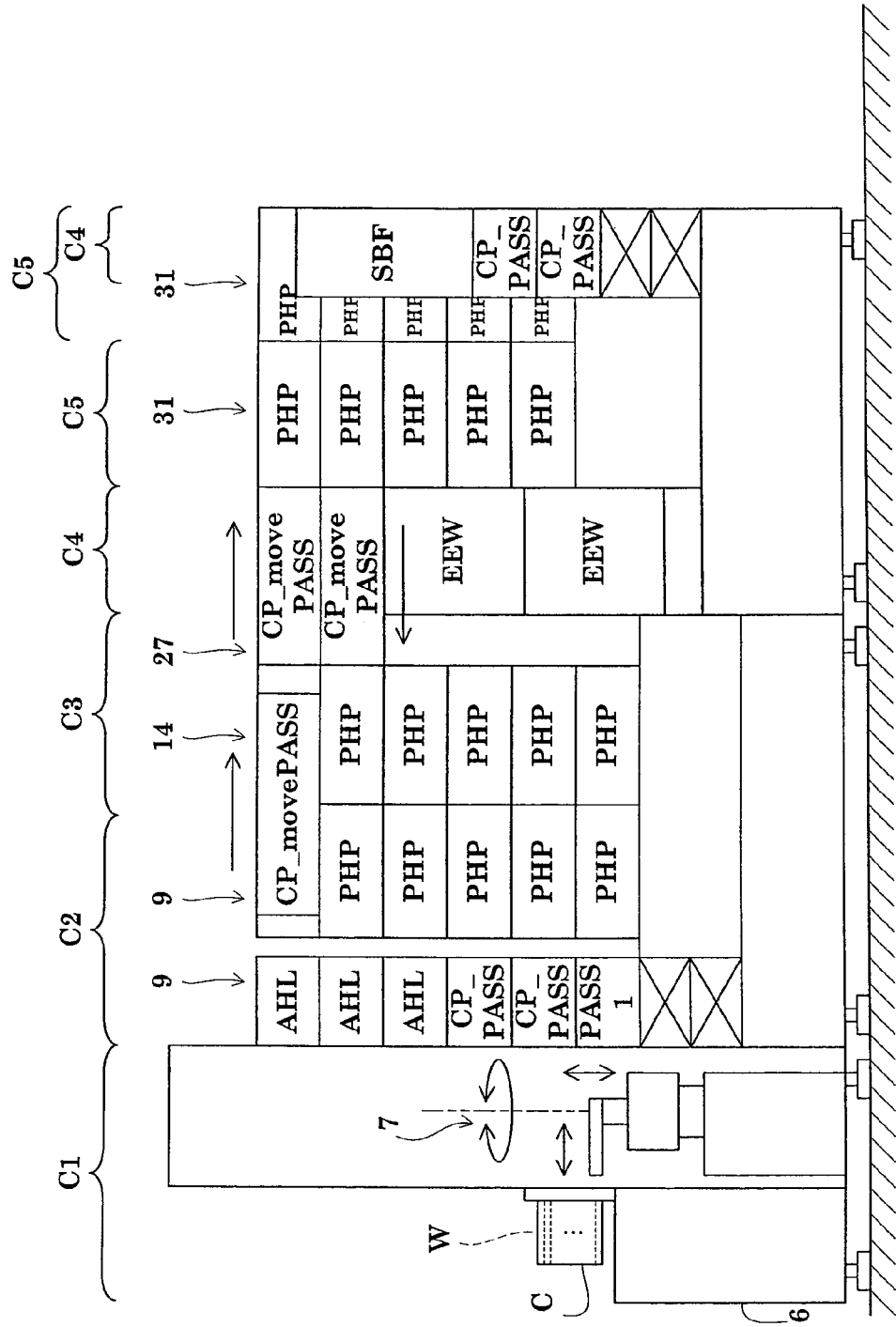
FIG. 19 is a front view of heat-treating modules.
Figure 20:
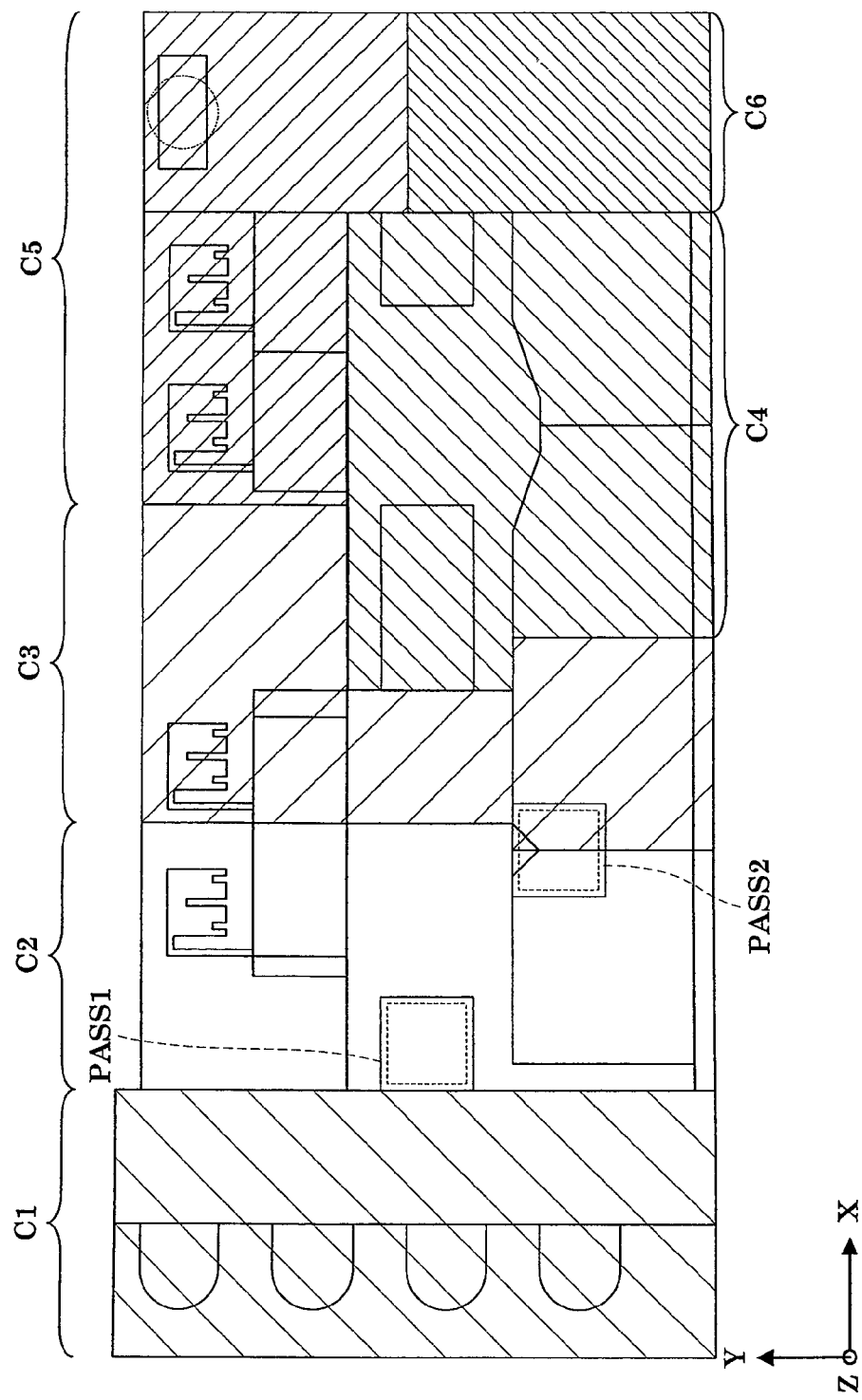
FIG. 20 is a plan view showing an arrangement of cells in the apparatus in the third embodiment.
Figure 21:
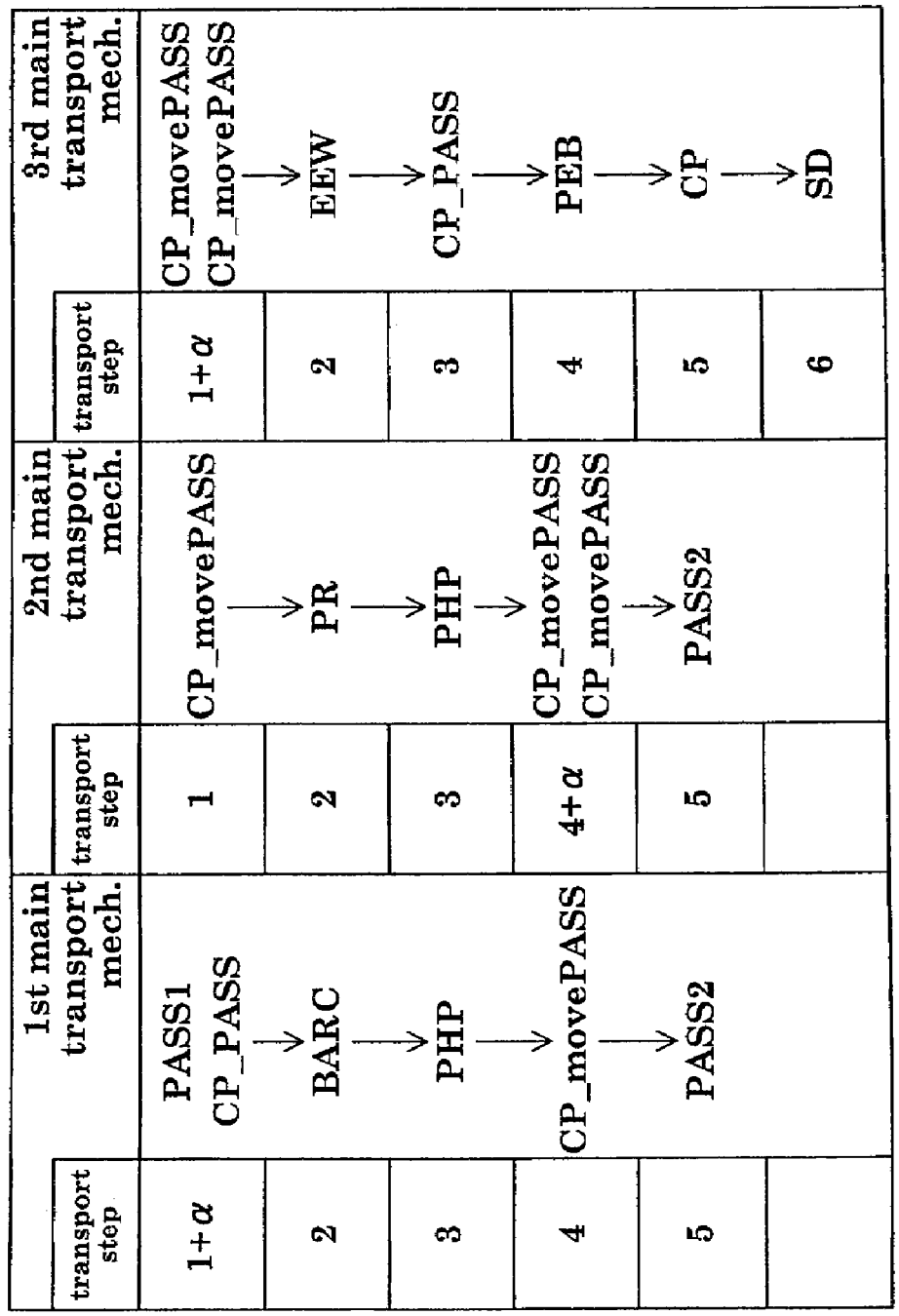
FIG. 21 is a view showing flows of substrate transport by first to fourth main transport mechanisms in the third embodiment.

FIG. 17 is a plan view of a substrate treating apparatus in the third embodiment. FIG. 18 is a front view thereof. FIG. 19 is a front view of heat-treating modules. FIG. 20 is a plan view showing an arrangement of cells in the apparatus. FIG. 21 is a view showing flows of substrate transport by first to fourth main transport mechanisms.

The substrate treating apparatus in the third embodiment has cells C1-C6 arranged as shown in FIGS. 17 and 20.

The antireflection film forming cell C2 in the third embodiment includes antireflection film coating modules 8, two groups of antireflection film heat-treating modules 9, and a first main transport mechanism 10A. The antireflection film coating modules 8 and one group of antireflection film heat-treating modules 9 are opposed to each other across the first main transport mechanism 10A. The other group of antireflection film heat-treating modules 9 is juxtaposed with the first main transport mechanism 10A in the forward/backward directions along the substrate transport path. As shown in FIG. 19, the antireflection film heat-treating modules 9 opposed to the antireflection film coating modules 8 include heating modules PHP, with temporary substrate deposits, stacked vertically. A cooling plate CP_movePASS is disposed at an upper end of these antireflection film heat-treating modules 9 to extend to adjoining resist film heat-treating modules 14. The cooling plate CP_movePASS serves to cool wafers W to room temperature and transfer the wafers W in the forward direction from the antireflection film heat-treating modules 9 to the resist film heat-treating modules 14. The antireflection film heat-treating modules 9 juxtaposed with the first main transport mechanism 10A include adhesion modules AHL, a substrate rest PASS1 and cooling plates CP_PASS stacked vertically. The functions of the substrate rest PASS1 and cooling plates CP_PASS are the same as in the first embodiment, and will not be described again.

The resist film forming cell C3 includes resist film coating modules 13, the above-noted resist film heat-treating modules 14, and a second main transport mechanism 10B. The resist film heat-treating modules 14 include heating modules PHP stacked vertically, and the above-noted cooling plate CP_movePASS disposed at an upper end thereof. A substrate rest PASS2 is provided to bridge the antireflection film forming cell C2 and resist film forming cell C3. This substrate rest PASS2 serves as a return substrate rest for returning wafers W in the backward direction from the resist film forming cell C3 to the antireflection film forming cell C2. As is clear from the above description, the cooling plate CP_movePASS bridging the antireflection film heat-treating modules 9 and resist film heat-treating modules 14 serves as a feed substrate rest for feeding wafers W from the antireflection film forming cell C2 to the resist film forming cell C3.

The developing cell C4 includes developing modules 26, two groups of heat-treating modules 27 and 28 for development, and a third main transport mechanisms 10C. The heat-treating modules 27 for development include, stacked vertically, a cooling plate CP_movePASS (feed substrate rest) for feeding wafers W in the forward direction from the resist film forming cell C3 to the developing cell C4, and a cooling plate CP_movePASS (return substrate rest) for returning wafers W in the backward direction from the developing cell C4 to the resist film forming cell C3. Edge exposing modules EEW are stacked under the heat-treating modules 27 for development. The heat-treating modules 28 for development include cooling plates CP_PASS stacked vertically, and a feed buffer SBF is mounted on the heat-treating modules 28. The cooling plates CP_PASS serve as feed substrate rests for feeding wafers W in the forward direction from the developing cell C4 to the interface cell C6, skipping the post-exposure baking cell C5.

The post-exposure baking cell C5 includes heat-treating modules 31 for post-exposure bake, a substrate return buffer RBF, and a fourth main transport mechanism 10D. The heat-treating modules 31 for post-exposure bake include heating modules PHP stacked vertically. The fourth main transport mechanism 10D in the third embodiment receives wafers W exposed in the exposing apparatus STP. The transport mechanism 34 of the interface cell C6 in the third embodiment receives edge-exposed wafers W from the cooling plates CP_PASS of the heat-treating modules 28, and successively transfers these wafers W to the exposing apparatus STP. In the third embodiment, the interface's transport mechanism 34 transports wafers W only in the forward direction without receiving exposed wafers W from the exposing apparatus STP.

The transport steps executed by the main transport mechanisms 10A-10D in the third embodiment are shown in FIG. 21. Specifically, the first main transport mechanism 10A of the antireflection film forming cell C2 transfers wafers W to and from the cooling plate CP_PASS and substrate rest PASS1 of the antireflection film heat-treating modules 9, transfers wafers W to and from the spin chuck 11 of an antireflection film coating module 8, transfers wafers W to and from a heating module PHP, transfers wafers W to the cooling plate CP_movePASS bridging the antireflection film heat-treating modules 9 and resist film heat-treating modules 14 to feed the wafers W from the antireflection film forming cell C2 to the resist film forming cell C3, and receives from the substrate rest PASS2 wafers W returned from the resist film forming cell C3.

The second main transport mechanism 10B of the resist film forming cell C3 receives wafers W from the cooling plate CP_movePASS fed from the antireflection film forming cell C2, transfers wafers W to and from the spin chuck 15 of a resist film coating module 13, transfers wafers W to and from a heating module PHP, transfers wafers W to and from the cooling plate CP_movePASS between the resist film forming cell C3 and developing cell C4, and transfers wafers W to the substrate rest PASS2 to return the wafers W to the antireflection film forming cell C2.

The third main transport mechanism 10C of the developing cell C4 transfers wafers W to and from the cooling plate CP_movePASS between the resist film forming cell C3 and developing cell C4, transfers wafers W to and from an edge exposing module EEW, transfers wafers W to the cooling plates CP_PASS to feed the wafers W in the forward direction to the interface cell C6, skipping the post-exposure baking cell C5, receives wafers W from the heating plates PHP of the heat-treating modules 31 for post-exposure bake, transfers wafers W to and from the cooling plates CP, and transfers wafers W to and from the spin chuck 29 of a developing module 26.

Figure 11C:
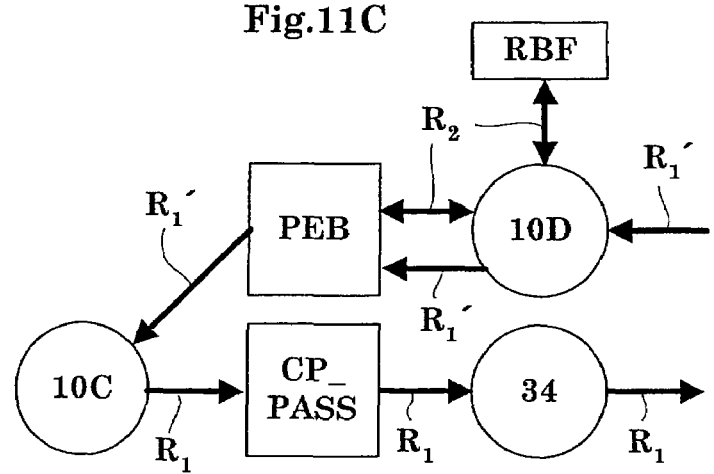
FIG. 11C is a plan view schematically showing substrate transport paths in the third embodiment.

From the construction of FIG. 17 and the transport steps described above, it will be understood that, as shown in FIG. 11C, a substrate transport path $R_1$ for transporting wafers W in the forward direction to the exposing apparatus STP (i.e. a path exclusive to the forward direction) includes, as arranged in the stated order adjacent the developing cell C4 and post-exposure baking cell C5, the third main transport mechanism 10C, cooling plate CP_PASS of the heat-treating modules 28 for development (transfer point), and interface's transport mechanism 34. A substrate transport path $R_1'$ for transporting wafers W in the backward direction after receiving the wafers W from the exposing apparatus STP (i.e. a path exclusive to the backward direction) includes, as arranged in the stated order, the fourth main transport mechanism 10D, heating plates PHP and third main transport mechanism 10C. The PEB-only substrate transport path $R_2$ and substrate transport path $R_1$ have no parts thereof overlapping each other. Separate individual transport mechanisms are used to form the substrate transport path (exclusive to the forward direction) $R_1$ and PEB-only substrate transport path $R_2$ (i.e. the interface's transport mechanism 34 being used for the path $R_1$, and the fourth main transport mechanism 10D for the path $R_2$). Thus, when a wafer W having received post-exposure baking treatment is transported to the buffer RBF because of a fault in the developing modules, wafers W transported in the backward direction have a reduced chance of causing a waiting time on the wafer W having received post-exposure baking treatment. A waiting time involved in the transport to the buffer RBF is less likely than where the same substrate transport mechanism is used for the paths $R_1$ and $R_2$. This arrangement allows the post-exposure baking treatment to be carried out with increased smoothness.

This invention is not limited to the embodiments described above, but may be modified as follows:

In each embodiment described above, the heating plates PHP for post-exposure bake have been described as predetermined treating modules forming the second substrate transport path. The heating plates PHP for post-exposure bake are not limitative, as long as the second substrate transport path is formed separately and independently by a predetermined substrate transport mechanism interposed between two juxtaposed transfer points, one being a temporary substrate rest for temporarily storing substrates and the other being predetermined treating modules. For example, the second substrate transport path may be formed for transporting substrates between the edge exposure modules EEW and feed buffer SBF.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus having heat-treating modules for heat-treating substrates, chemical treating modules for chemically treating the substrates, and substrate transport mechanisms for transferring the substrates to and from a treating unit including the heat-treating modules and the chemical treating modules, wherein:
    said heat-treating modules include cooling modules for cooling the substrates, and heating modules for heating the substrates;
    said cooling modules and said heating modules are thermally divided from each other;
    said heating modules and said chemical treating modules form treating blocks opposed to each other across a substrate transport path formed along the treating units; and
    said cooling modules serve to transfer the substrates between said treating blocks.

* * * * *